(12) United States Patent
Daimon et al.

(10) Patent No.: US 11,418,158 B2
(45) Date of Patent: Aug. 16, 2022

(54) RADIO-FREQUENCY MODULE AND COMMUNICATION DEVICE

(71) Applicant: Murata Manufacturing Co., Ltd., Kyoto (JP)

(72) Inventors: Yoshihiro Daimon, Kyoto (JP); Kenji Tahara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 119 days.

(21) Appl. No.: 16/837,601

(22) Filed: Apr. 1, 2020

(65) Prior Publication Data

US 2020/0321929 A1    Oct. 8, 2020

(30) Foreign Application Priority Data

Apr. 3, 2019    (JP) .............................. JP2019-071420

(51) Int. Cl.
| | |
|---|---|
| *H03F 3/191* | (2006.01) |
| *H03F 3/24* | (2006.01) |
| *H03F 3/195* | (2006.01) |
| *H03F 3/21* | (2006.01) |
| *H04B 1/04* | (2006.01) |
| *H03F 1/56* | (2006.01) |

(52) U.S. Cl.
CPC ............ *H03F 3/245* (2013.01); *H03F 1/565* (2013.01); *H03F 3/195* (2013.01); *H03F 3/211* (2013.01); *H04B 1/0458* (2013.01); *H03F 2200/294* (2013.01); *H03F 2200/318* (2013.01); *H03F 2200/451* (2013.01)

(58) Field of Classification Search
CPC . H03F 1/56; H03F 3/191; H03F 3/193; H03F 2200/222
USPC ......................................... 330/302, 306, 307
See application file for complete search history.

(56) References Cited

U.S. PATENT DOCUMENTS

| | | | | |
|---|---|---|---|---|
| 7,565,116 | B2 * | 7/2009 | Okuyama ............ | H04B 1/0057 330/302 |
| 2010/0182097 | A1 | 7/2010 | Hayashi et al. | |

FOREIGN PATENT DOCUMENTS

| | | |
|---|---|---|
| JP | 2004-304628 A | 10/2004 |
| JP | 2018-137522 A | 8/2018 |
| WO | 2008/018565 A1 | 2/2008 |

* cited by examiner

*Primary Examiner* — Steven J Mottola
(74) *Attorney, Agent, or Firm* — Pearne & Gordon LLP

(57) ABSTRACT

A first power amplifier amplifies first transmission signals in a first frequency band and outputs the resultant signals. A first matching circuit includes a plurality of first inductor portions and is connected to an output pad electrode of the first power amplifier. A second power amplifier amplifies second transmission signals in a second frequency band higher than the first frequency band and outputs the resultant signals. A second matching circuit includes at least one second inductor portion and is connected to an output side of the second power amplifier. A multilayer substrate has a first main surface and a second main surface located opposite to each other and is provided with the first and second power amplifiers and the first and second matching circuits. The first inductor portion closer than the other first inductor portions to the output pad electrode includes an inner-layer inductor portion located in the multilayer substrate.

20 Claims, 12 Drawing Sheets dio-frequency module capable of suppressing coupling
RADIO-FREQUENCY MODULE AND COMMUNICATION DEVICE This application claims priority from Japanese Patent Application No. 2019-071420 filed on Apr. 3, 2019. The content of this application is incorporated herein by reference in its entirety.

BACKGROUND OF THE DISCLOSURE

1. Field of the Disclosure

The present disclosure generally relates to a radio-frequency module and to a communication device including the radio-frequency module. More specifically, the present disclosure relates to a radio-frequency module for a first frequency band and a second frequency band higher than the first frequency band and to a communication device including the radio-frequency module.

2. Description of the Related Art

A radio-frequency module and a communication device including the radio-frequency module as a front-end circuit are known (see, for example, Japanese Unexamined Patent Application Publication No. 2018-137522).

The radio-frequency module disclosed in Japanese Unexamined Patent Application Publication No. 2018-137522 is a composite component that processes radio-frequency signals in a plurality of frequency bands and includes a plurality of circuit blocks formed on a substrate. The circuit blocks include, for example, a low-noise amplifier circuit and a power amplifier circuit.

The low-noise amplifier circuit includes a plurality of low-noise amplifiers and a plurality of filters. The low-noise amplifiers and the filters are located on the corresponding signal paths provided for different frequency bands.

The power amplifier circuit includes a plurality of power amplifiers and a plurality of filters. The power amplifiers and the filters are located on the corresponding signal paths provided for different frequency bands.

The radio-frequency module may, for example, include: a first transmitting circuit including a first power amplifier and a first matching circuit; and second transmitting circuit including a second power amplifier and a second matching circuit. When the frequency of a double wave that is one of the harmonic waves of first transmission signals in the first transmitting circuit overlaps the frequency band of second transmission signals in the second transmitting circuit, an inductor portion in the first matching circuit may be coupled with an inductor portion in the second matching circuit. The radio-frequency module may, for example, include: a transmitting circuit including a power amplifier and a first matching circuit; and a receiving circuit including a low-noise amplifier and a second matching circuit. When the frequency of a double wave that is one of harmonic waves of transmission signals in the transmitting circuit overlaps the frequency band of reception signals in the receiving circuit, an inductor portion in the first matching circuit may be coupled with an inductor portion in the second matching circuit.

BRIEF SUMMARY OF THE DISCLOSURE

It is an object of the present disclosure to provide: a radio-frequency module capable of suppressing coupling between a first inductor portion in a first matching circuit and a second inductor portion in a second matching circuit; and a communication device including the radio-frequency module.

The radio-frequency module according to an aspect of the present disclosure includes a first power amplifier, a first matching circuit, a second power amplifier, a second matching circuit, and a multilayer substrate. The first power amplifier includes an output pad electrode and is configured to amplify first transmission signals in a first frequency band and to output resultant signals from the output pad electrode. The first matching circuit includes a plurality of first inductor portions and is connected to the output pad electrode of the first power amplifier. The second power amplifier is configured to amplify second transmission signals in a second frequency band higher than the first frequency band and to output resultant signals. The second matching circuit includes at least one second inductor portion and is connected to an output side of the second power amplifier. The multilayer substrate has a first main surface and a second main surface located opposite to each other and is provided with the first power amplifier, the first matching circuit, the second power amplifier, and the second matching circuit. The first inductor portion closer than the other first inductor portions to the output pad electrode includes an inner-layer inductor portion located in the multilayer substrate.

A communication device according to another aspect of the present disclosure includes the radio-frequency module and a signal processing circuit configured to process the first transmission signals and the second transmission signals.

A radio-frequency module according to still another aspect of the present disclosure includes a power amplifier, a first matching circuit, a low-noise amplifier, a second matching circuit, and a multilayer substrate. The power amplifier includes an output pad electrode and is configured to amplify transmission signals in a first frequency band and to output resultant signals from the output pad electrode. The first matching circuit includes a plurality of first inductor portions and is connected to the output pad electrode of the power amplifier. The low-noise amplifier is configured to amplify reception signals in a second frequency band higher than the first frequency band and to output resultant signals. The second matching circuit includes at least one second inductor portion and is connected to an input pad electrode of the low-noise amplifier. The multilayer substrate has a first main surface and a second main surface located opposite to each other and is provided with the power amplifier, the first matching circuit, the low-noise amplifier, and the second matching circuit. The first inductor portion closer than the other first inductor portions to the output pad electrode includes an inner-layer inductor portion located in the multilayer substrate.

A communication device according to yet still another aspect of the present disclosure includes the radio-frequency module and a signal processing circuit configured to process the transmission signals and the reception signals.

Other features, elements, characteristics, and advantages of the present disclosure will become more apparent from the following detailed description of preferred embodiments of the present disclosure with reference to the attached drawings.

DETAILED DESCRIPTION OF THE DISCLOSURE

Figure 1:
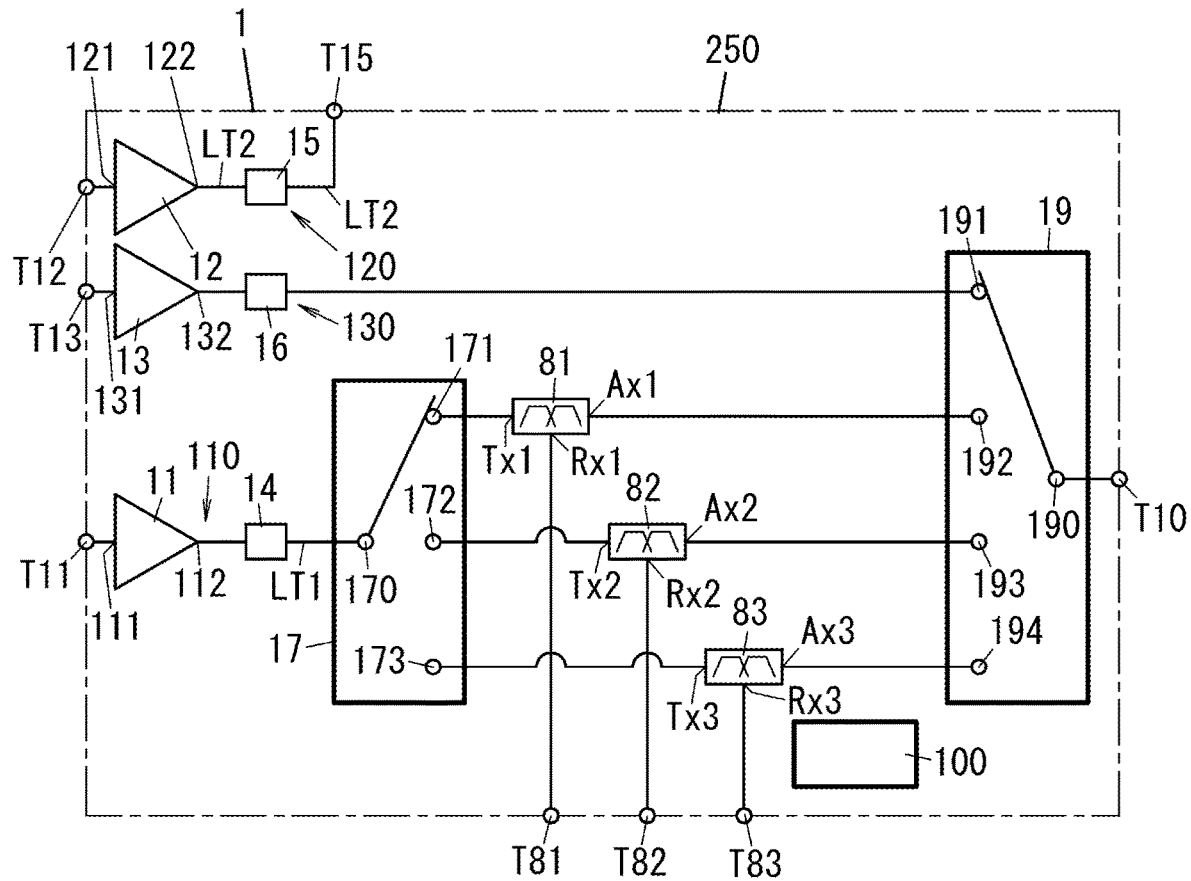
FIG. 1 is a circuit diagram of a radio-frequency module according to Embodiment 1.

FIGS. 5A to 9, 11, and 12, which will be referred to in, for example, Embodiments 1 to 5, are schematic views, in which constituent elements are not drawn to scale and the size and thickness ratios thereof may not fully correspond to the actual dimension ratios.

Embodiment 1

The following describes, with reference to the drawings, a radio-frequency module according to Embodiment 1 and a communication device including the radio-frequency module.

1. Circuit Configuration of Radio-Frequency Module and Circuit Configuration of Communication Device Including Radio-Frequency Module The following describes, with reference to FIGS. 1 to 6, a circuit configuration of a radio-frequency module 1 according to Embodiment 1 and a circuit configuration of a communication device 400 including the radio-frequency module 1. The radio-frequency module 1 according to Embodiment 1 includes a radio-frequency front-end circuit 250, which is to be included in, for example, a mobile communication device (e.g., a mobile phone) having multi-band features and supporting simultaneous use of two frequency bands (e.g., carrier aggregation). The radio-frequency module 1 supports, for example, carrier aggregation for the midband specified by the second-generation mobile communication (2G) standard and the low band specified by the fourth-generation mobile communication (4G) standard. In some embodiments, the radio-frequency module 1 may support dual connectivity for the midband specified by the 2G standard and the low band specified by the fifth-generation mobile communication (5G). The 2G standard is, for example, the Global System for Mobile Communications (GSM) (registered trademark) standard. The 4G standard is, for example, the 3GPP Long Term Evolution (LTE) standard. The 5G standard is, for example, 5G New Radio (NR). The low band specified by the GSM (registered trademark) standard includes GSM-850 and GSM-900. The midband specified by the GSM (registered trademark) standard includes GSM-1800 and GSM-1900. The low band specified by the 3GPP LTE standard includes Band 12. Band 12 covers a downlink frequency range of 729 to 746 MHz and an uplink frequency range of 699 to 716 MHz. The midband specified by the 3GPP LTE standard includes, for example, Band 3 and Band 1. Band 3 covers a downlink frequency range of 1,805 to 1,880 MHz and an uplink frequency range of 1,710 to 1,785 MHz. Band 1 covers a downlink frequency range of 2,110 to 2,170 MHz and an uplink frequency range of 1,920 to 1,980 MHz.

The communication device 400 including the radio-frequency module 1 supports carrier aggregation (downlink carrier aggregation) involving simultaneous use of a plurality of frequency bands (two frequency bands in Embodiment 1) for downlink. The communication device 400 including the radio-frequency module 1 also supports carrier aggregation (uplink carrier aggregation) involving simultaneous use of a plurality of frequency bands (two frequency bands in Embodiment 1) for uplink. The low band specified by the 3GPP LTE standard includes, for example, Band 8. Band 8 covers a downlink frequency range of 925 to 960 MHz and an uplink frequency range of 880 to 915 MHz. The communication device 400 including the radio-frequency module 1 may support the dual connectivity in place of the carrier aggregation. In this case, the low band specified by the 5G NR includes, for example, n8 and n28. The n8 band covers a downlink frequency range of 925 to 960 MHz and an uplink frequency range of 880 to 915 MHz. The n28 band covers a downlink frequency range of 758 to 803 MHz and an uplink frequency range of 703 to 748 MHz.

1.1 Circuit Configuration of Radio-Frequency Module

As illustrated in FIG. 1, the radio-frequency module 1 includes a first transmitting circuit 110, a second transmitting circuit 120, and a third transmitting circuit 130. The first transmitting circuit 110 includes a power amplifier 11 (hereinafter also referred to as "first power amplifier 11") and a first matching circuit 14. The second transmitting circuit 120 includes a second power amplifier 12 and a second matching circuit 15. The third transmitting circuit 130 includes a third power amplifier 13 and a third matching circuit 16. The radio-frequency module 1 also includes an antenna terminal T10 and a plurality of signal input terminals (e.g., three signal input terminals (T11, T12, and T13) as illustrated in FIG. 1). The radio-frequency module 1 also includes a bypass terminal T15 and an antenna switch 19. The radio-frequency module 1 also includes a plurality of signal output terminals (e.g., three signal output terminals (T81, T82, and T83) as illustrated in FIG. 1).

The first power amplifier 11 includes an input terminal 111 and an output terminal 112 (hereinafter also referred to as "output pad electrode 112"). The first power amplifier 11 amplifies first transmission signals inputted to the input terminal 111 and lying in the low band specified by the 4G or 5G standard and outputs resultant signals from the output terminal 112. The first transmission signals are transmission signals in a first frequency band specified by the 4G or 5G standard. The input terminal 111 of the first power amplifier 11 is connected to the signal input terminal T11. The output terminal 112 of the first power amplifier 11 is connected to the first matching circuit 14. That is, the output pad electrode 112 of the first power amplifier 11 is connected to the first matching circuit 14.

The second power amplifier 12 includes an input terminal 121 and an output terminal 122 (hereinafter also referred to as "output pad electrode 122"). The second power amplifier 12 amplifies second transmission signals inputted to the input terminal 121 and lying in the midband specified by the 2G standard and outputs resultant signals from the output terminal 122. The second transmission signals are transmission signals in a second frequency band specified by the 2G standard. The lower limit frequency of the second frequency band is higher than the upper frequency limit of the first frequency band. The input terminal 121 of the second power amplifier 12 is connected to the signal input terminal T12. The output terminal 122 of the second power amplifier 12 is connected to the second matching circuit 15. That is, the output pad electrode 122 of the second power amplifier 12 is connected to the second matching circuit 15.

The third power amplifier 13 includes an input terminal 131 and an output terminal 132. The third power amplifier 13 amplifies third transmission signals inputted to the input terminal 131 and lying in the low band specified by the 2G standard and outputs the resultant signals from the output terminal 132. The third transmission signals are transmission signals in a third frequency band specified by the 2G standard. The input terminal 131 of the third power amplifier 13 is connected the signal input terminal T13. The output terminal 132 of the third power amplifier 13 is connected to the third matching circuit 16.

The frequency band in which the first transmission signals lie (the first frequency band) includes, for example, Band 12 specified by the LTE standard. The frequency band in which the third transmission signals lie (the third frequency band) includes, for example, the GSM-850 frequency band and the GSM-900 frequency band. The frequency band in which the second transmission signals lie (the second frequency band) includes, for example, the GSM-1800 frequency band and the GSM-1900 frequency band.

Figure 4:
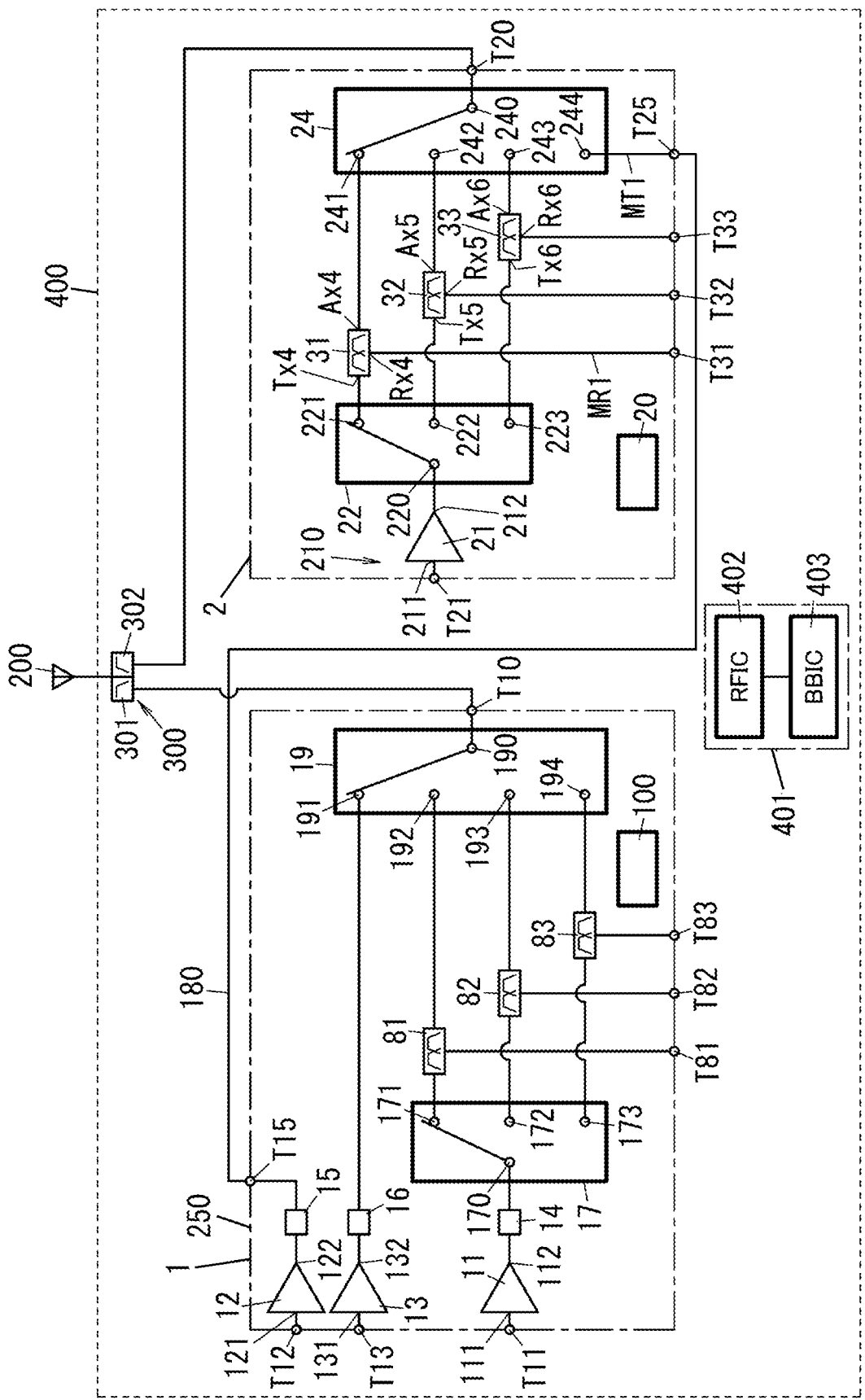
FIG. 4 is a circuit diagram of a communication device including the radio-frequency module.

The antenna terminal T10 is electrically connected to an antenna 200 (see FIG. 4).

The bypass terminal T15 is electrically connected to the output terminal 122 of the second power amplifier 12. More specifically, the bypass terminal T15 is electrically connected to the output terminal 122 of the second power amplifier 12 via the second matching circuit 15. The bypass terminal T15 is connected to the output pad electrode 122 of the second power amplifier 12 via the second matching circuit 15 and is provided to output, to an outside of the radio-frequency module 1 (to a radio-frequency module 2 illustrated in FIG. 4), the second transmission signals from the second power amplifier 12.

The antenna switch 19 is disposed between the antenna terminal T10 and the output terminal 112 of the first power amplifier 11 and between the antenna terminal T10 and the output terminal 132 of the third power amplifier 13. The antenna switch 19 includes a common terminal 190 and four selection terminals, namely, selection terminals 191 to 194. The common terminal 190 of the antenna switch 19 is connected to the antenna terminal T10.

The first matching circuit 14 is disposed between the output terminal 112 of the first power amplifier 11 and each of the selection terminals 192 to 194 of the antenna switch 19. The radio-frequency module 1 includes a plurality of duplexers (e.g., three duplexers (81, 82, and 83) as illustrated in FIG. 1) and a band change-over switch 17, which are disposed between the first matching circuit 14 and the antenna switch 19. Thus, the first matching circuit 14 is disposed between the output terminal 112 of the first power amplifier 11 and the band change-over switch 17. The first matching circuit 14 is the impedance matching circuit for matching the output impedance of a circuit antecedent to the first matching circuit 14 to the input impedance of a circuit subsequent to the first matching circuit 14. More specifically, with the first matching circuit 14 being viewed from the first power amplifier 11, the first matching circuit 14 adjusts the impedance on the antenna terminal T10 side (the output impedance of the first power amplifier 11) in the fundamental frequency of the first transmission signals to, for example, 50Ω.

The second matching circuit 15 is disposed between the output terminal 122 of the second power amplifier 12 and the bypass terminal T15. The second matching circuit 15 is the impedance matching circuit for matching the output impedance of a circuit antecedent to the second matching circuit 15 to the input impedance of a circuit subsequent to the second matching circuit 15. More specifically, with the second matching circuit 15 being viewed from the second power amplifier 12, the second matching circuit 15 adjusts the impedance in the fundamental frequency of the second transmission signals on the bypass terminal T15 side (the output impedance of the second power amplifier 12) to, for example, 50Ω.

The third matching circuit 16 is disposed between the output terminal 132 of the third power amplifier 13 and the selection terminal 191 of the antenna switch 19. The third matching circuit 16 is the impedance matching circuit for matching the output impedance of a circuit antecedent to the third matching circuit 16 to the input impedance of a circuit subsequent to the third matching circuit 16. More specifically, with the third matching circuit 16 being viewed from the third power amplifier 13, the third matching circuit 16 adjusts the impedance in the fundamental frequency of the third transmission signals on the antenna terminal T10 side (the output impedance of the third power amplifier 13) to, for example, 50Ω.

Each of the duplexers 81 to 83 includes a receiving filter and a transmitting filter. The receiving filter allows signals in a reception frequency band to pass therethrough and attenuates signals in frequency bands other than the reception frequency band. The transmitting filter allows signals in a transmission frequency band to pass therethrough and attenuates signals in frequency bands other than the transmission frequency band. The receiving filter and the transmitting filter are, for example, surface acoustic wave (SAW) filters. In some embodiments, the receiving filter and the transmitting filter may be bulk acoustic wave (BAW) filters or dielectric filters.

The duplexers 81 to 83 are assigned with different transmission frequency bands and different reception frequency bands.

The duplexers 81 includes an antenna-side terminal Ax1, a transmission terminal Tx1, and a reception terminal Rx1. The duplexer 82 includes an antenna-side terminal Ax2, a transmission terminal Tx2, and a reception terminal Rx2. The duplexer 83 includes an antenna-side terminal Ax3, a transmission terminal Tx3, and a reception terminal Rx3. The antenna-side terminals Ax1 to Ax3 included respectively in the duplexers 81 to 83 are connected to the antenna switch 19. Output terminals of the receiving filters of the duplexers 81 to 83 are used respectively as the reception terminals Rx1, Rx2, and Rx3 and are connected respectively to the signal output terminals T81, T82, and T83. Input terminals of the transmitting filters of the duplexers 81 to 83 are used respectively as the transmission terminals Tx1, Tx2, and Tx3 and are connected respectively to selection terminals 171 to 173 of the band change-over switch 17. Terminals (ANT terminals) included respectively in the duplexers 81 to 83 and connected to output terminals of the corresponding transmitting filters and to input terminals of the corresponding receiving filters are used respectively as the antenna-side terminals Ax1, Ax2, and Ax3 and are connected respectively to the selection terminals 192 to 194 of the antenna switch 19.

The antenna switch 19 is disposed between the antenna terminal T10 and each of the duplexers 81 to 83. The selection terminal 191 of the antenna switch 19 is connected to the third matching circuit 16 and the selection terminals 192 to 194 of the antenna switch 19 are connected respectively to the duplexers 81 to 83. The antenna switch 19 is, for example, a switching integrated circuit (IC).

The band change-over switch 17 is disposed between the output terminal 112 of the first power amplifier 11 and each of the transmission terminals Tx1 to Tx3 included respectively in the duplexers 81 to 83. The band change-over switch 17 connects one of the duplexers 81 to 83 to the output terminal 112 of the first power amplifier 11.

The radio-frequency module 1 also includes a control circuit 100. The control circuit 100 receives control signals from, for example, a baseband signal processing circuit 403 (see FIG. 4) located outside the radio-frequency module 1 and controls, in accordance with the control signals, the first power amplifier 11, the second power amplifier 12, the third power amplifier 13, the antenna switch 19, and the band change-over switch 17. The control circuit 100 is, for example, an IC.

Figure 2:
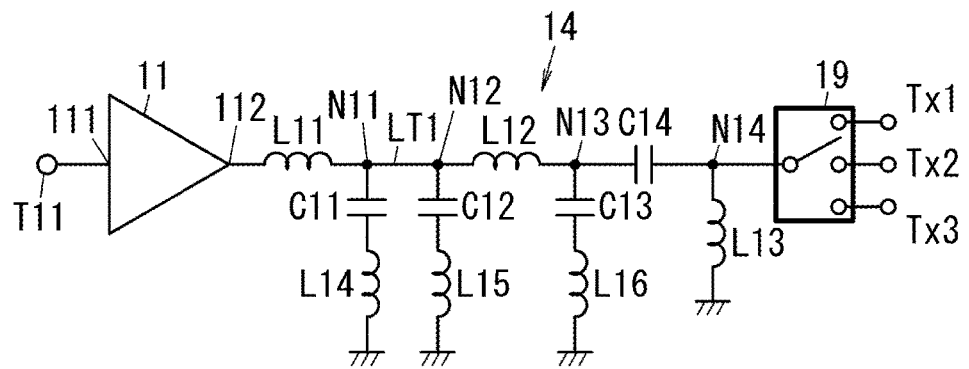
FIG. 2 is a circuit diagram of a first matching circuit included in the radio-frequency module.

The first matching circuit 14 includes a plurality of first inductor portions (e.g., six first inductor portions (L11 to L16) as illustrated in FIG. 2). The first matching circuit 14 also includes a plurality of capacitors (e.g., four capacitors (C11 to C14) as illustrated in FIG. 2). One end of the first inductor portion L11 in the first matching circuit 14 is connected to the output terminal 112 of the first power amplifier 11, and the other end of the first inductor portion L11 is connected to the antenna switch 19 via a series circuit including the first inductor portion L12 and the capacitor C14. The first inductor portion L11, the first inductor portion L12, and the capacitor C14 in the first matching circuit 14 are located on a signal path LT1, which is connected to the output terminal 112 (the output pad electrode 112) of the first power amplifier 11. That is, the first matching circuit 14 includes the first inductor portions L11 and L12, which are series inductor portions on the signal path LT1. The capacitor C11 and the first inductor portion L14 in the first matching circuit 14 constitute a series circuit connected between the ground and a node N11, which is located between the first inductor portions L11 and L12 on the signal path LT1. The capacitor C12 and the first inductor portion L15 in the first matching circuit 14 constitute a series circuit connected between the ground and a node N12, which is located between the first inductor portions L11 and L12 on the signal path LT1. The capacitor C13 and the first inductor portion L16 in the first matching circuit 14 constitute a series circuit connected between the ground and a node N13, which is located between the first inductor portion L12 and the capacitor C14 on the signal path LT1. The first inductor portion L13 in the first matching circuit 14 is connected between the ground and a node N4, which is located between the antenna switch 19 and the capacitor C14 on the signal path LT1. The first matching circuit 14 also serves as a first filter. The first filter allows the first transmission signals in the first frequency band to pass therethrough and attenuates signals in frequency bands other than the first frequency band.

Figure 3:
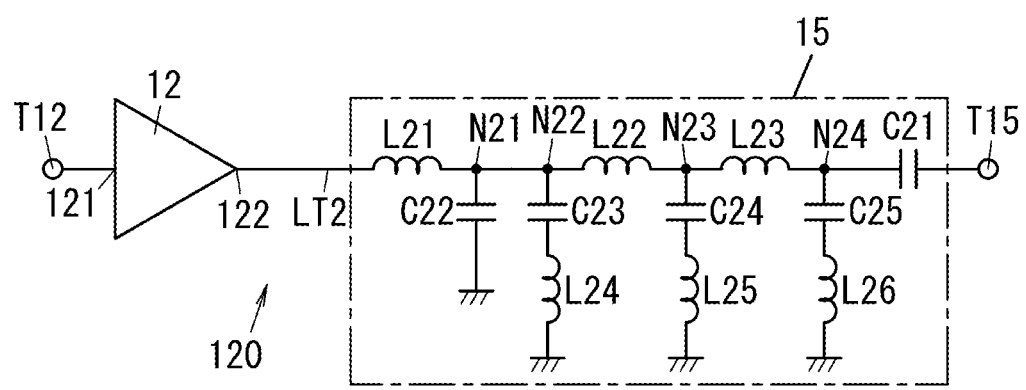
FIG. 3 is a circuit diagram of a second matching circuit included in the radio-frequency module.

As illustrated in FIG. 3, the second matching circuit 15 includes, for example, at least one second inductor portion (e.g., a second inductor portion L21). The second matching circuit 15 in the present embodiment includes six second inductor portions (L21 to L26). The second matching circuit 15 also includes a plurality of capacitors (e.g., five capacitors (C21 to C25) as illustrated in FIG. 3). One end of the second inductor portion L21 in the second matching circuit 15 is connected to the output terminal 122 of the second power amplifier 12, and the other end of the second inductor portion L21 is connected to the bypass terminal T15 via a series circuit including the second inductor portions L22 and L23 and the capacitor C21. The second inductor portions L21 to L23 and the capacitor C21 in the second matching circuit 15 are located on a signal path LT2, which is connected to the output terminal 122 (the output pad electrode 122) of the second power amplifier 12. That is, the second matching circuit 15 includes the second inductor portion L21, the second inductor portion L22, and the second inductor portion L23, which are series inductor portions on the signal path LT2. The capacitor C22 in the second matching circuit 15 is connected between the ground and a node N21, which is located between the second inductor portions L21 and L22 on the signal path LT2. The capacitor C23 and the second inductor portion L24 in the second matching circuit 15 constitute a series circuit connected parallel to the capacitor C22 and connected between the ground and a node N22, which is located between the second inductor portions L21 and L22 on the signal path LT2. The capacitor C24 and the second inductor portion L25 in the second matching circuit 15 constitute a series circuit connected between the ground and a node N23, which is located between the second inductor portions L22 and L23. The capacitor C25 and the second inductor portion L26 in the second matching circuit 15 constitute a series circuit connected between the ground and a node N24, which is located between the second inductor portion L23 and the capacitor C21. The second matching circuit 15 also serves as a second filter. The second filter allows the second reception signals in the second frequency band to pass therethrough and attenuates signals in frequency bands other than the second frequency band.

The third matching circuit 16 includes a plurality of third inductor portions (e.g., two third inductor portions) and a plurality of capacitors (e.g., two capacitors). The third matching circuit 16 also serves as a third filter. The third filter allows the third transmission signals in the third frequency band to pass therethrough and attenuates signals in frequency bands other than the third frequency band.

The radio-frequency module 1 also includes a first bias circuit, a second bias circuit, and a third bias circuit that supply a bias voltage from the control circuit 100 to the first power amplifier 11, the second power amplifier 12, and the third power amplifier 13, respectively. The control circuit 100 controls the first power amplifier 11, the second power amplifier 12, and the third power amplifier 13 in such a manner as to change operating voltages supplied respectively to the first power amplifier 11, the second power amplifier 12, and the third power amplifier 13 via the first bias circuit, the second bias circuit, and the third bias circuit.

1.2 Circuit Configuration of Communication Device

As illustrated in FIG. 4, the communication device 400 includes a diplexer 300, the radio-frequency module 1 (hereinafter also referred to as "first radio-frequency module 1"), and the radio-frequency module 2 (hereinafter also referred to as "second radio-frequency module 2"). The communication device 400 also includes a signal processing circuit 401. The signal processing circuit 401 processes the first transmission signals and the second transmission signals. The signal processing circuit 401 includes a radio-frequency (RF) signal processing circuit 402 and the baseband signal processing circuit 403.

The diplexer 300 includes a filter 301 and a filter 302 and is connected to the antenna 200. The filter 301 is a low-pass filter. The filter 302 is a high-pass filter.

The first radio-frequency module 1 is electrically connected to the filter 301 of the diplexer 300. The first radio-frequency module 1 is thus electrically connected to the antenna 200 via the filter 301.

The second radio-frequency module 2 is electrically connected to the filter 302 of the diplexer 300. The second radio-frequency module 2 is thus electrically connected to the antenna 200 via the filter 302.

The antenna terminal T10 in the first radio-frequency module 1 is connected to the filter 301.

The signal input terminals T11 to T13 and the signal output terminals T81 to T83 in the first radio-frequency module 1 are connected to (the RF signal processing circuit 402 included in) the signal processing circuit 401.

The second radio-frequency module 2 includes: an antenna terminal T20; a fourth transmitting circuit 210 including a fourth power amplifier 21; a signal input terminal T21; and an antenna switch 24. The second radio-frequency module 2 also includes a transmission path MT1, a plurality of duplexers (e.g., three duplexers (31, 32, and 33) as illustrated in FIG. 4), a band change-over switch 22, and a plurality of signal output terminals (e.g., three signal output terminals (T31, T32, and T33) as illustrated in FIG. 4). The second radio-frequency module 2 also includes a relay terminal T25, which is connected to the signal path MT1.

The antenna terminal T20 is connected to the filter 302 of the diplexer 300.

The fourth power amplifier 21 includes an input terminal 211 and an output terminal 212. The fourth power amplifier 21 amplifies fourth transmission signals inputted to the input terminal 211 and lying in the midband specified by the 4G or 5G standard and outputs the resultant signals from the output terminal 212. The fourth transmission signals are transmission signals in a fourth frequency band specified by the 4G or 5G standard. The input terminal 211 of the fourth power amplifier 21 is connected to the signal input terminal T21.

The antenna switch 24 is disposed between the output terminal 212 of the fourth power amplifier 21 and the antenna terminal T20. The antenna switch 24 is disposed between the antenna terminal T20 and each of the plurality of duplexers (e.g., three the duplexers (31 to 33) as illustrated in FIG. 4). The antenna switch 24 includes a common terminal 240 and a plurality of selection terminals (e.g., four selection terminals (241 to 244) as illustrated in FIG. 4). The common terminal 240 of the antenna switch 24 is connected to the antenna terminal T20. The selection terminals 241 to 243 of the antenna switch 24 are connected respectively to the duplexers 31 to 33, and the selection terminal 244 is connected to the relay terminal T25 via the transmission path MT1. The antenna switch 24 is, for example, a switching IC. The antenna switch 24 provides, for example, an isolation of about 20 to 30 dB.

The transmission path MT1 is connected to the antenna switch 24 and to the bypass terminal T15 in the first radio-frequency module 1. More specifically, the transmission path MT1 is connected to the bypass terminal T15 in the first radio-frequency module 1 via the relay terminal T25.

The duplexer 31 includes an antenna-side terminal Ax4, a transmission terminal Tx4, and a reception terminal Rx4. The duplexer 32 includes an antenna-side terminal Ax5, a transmission terminal Tx5, and a reception terminal Rx5. The duplexer 33 includes an antenna-side terminal Ax6, a transmission terminal Tx6, and a reception terminal Rx6. The antenna-side terminals Ax4 to Ax6 included respectively in the duplexers 31 to 33 are connected to the antenna switch 24. Output terminals of receiving filters of the duplexers 31 to 33 are used respectively as the reception terminals Rx4, Rx5, and Rx6 and are connected respectively to the signal output terminals T31, T32, and T33. Input terminals of transmitting filters of the duplexers 31 to 33 are used respectively as the transmission terminals Tx4, Tx5, and Tx6 and are connected respectively to selection terminals 221 to 223 of the band change-over switch 22. Terminals (ANT terminals) included respectively in the duplexers 31 to 33 and connected to output terminals of the corresponding transmitting filters and to input terminals of the corresponding receiving filters are used respectively as the antenna-side terminals Ax4, Ax5, and Ax6 and are connected respectively to the selection terminals 241 to 243 of the antenna switch 24.

The band change-over switch 22 is disposed between the output terminal 212 of the fourth power amplifier 21 and each of the transmission terminals Tx4, Tx5, and Tx6 included respectively in the duplexers 31, 32, and 33. The band change-over switch 22 connects one of the duplexers 31 to 33 to the output terminal 212 of the fourth power amplifier 21.

The signal output terminals T31, T32, and T33 are connected respectively to the reception terminals Rx4, Rx5, and Rx6 included respectively in the duplexers 31, 32, and 33.

The RF signal processing circuit 402 is connected to the first radio-frequency module 1 and the second radio-frequency module 2. More specifically, the RF signal processing circuit 402 is connected to the signal input terminals T11 to T13 in the first radio-frequency module 1 and to the signal output terminals T81 to T83 in the first radio-frequency module 1. The RF signal processing circuit 402 is also connected to the signal input terminal T21 and the signal output terminals T31 to T33 in the second radio-frequency module 2.

The RF signal processing circuit 402 is, for example, a radio-frequency integrated circuit (RFIC). The RF signal processing circuit 402 processes radio-frequency signals (reception signals) outputted from the signal output terminals T81 to T83 and radio-frequency signals (reception signals) outputted from the signal output terminals T31 to T33 for the midband. The RF signal processing circuit 402 performs signal processing such as down-conversion on radio-frequency signals (reception signals) inputted from the antenna 200 through the first radio-frequency module 1 or through the second radio-frequency module 2 and outputs the resultant reception signals to the baseband signal processing circuit 403.

The baseband signal processing circuit 403 is, for example, a baseband integrated circuit (BBIC). The reception signals processed by the baseband signal processing circuit 403 are used, for example, as image signals for displaying an image or as audio signals for a telephone conversation.

The RF signal processing circuit 402 also performs signal processing such as up-conversion on transmission signals outputted by the baseband signal processing circuit 403 and outputs the resultant transmission signals (radio-frequency signals) to the first radio-frequency module 1 or the second radio-frequency module 2. The baseband signal processing circuit 403 performs certain signal processing on transmission signals received from outside the communication device 400.

The communication device 400 also includes a bypass path 180 and a control circuit 20.

The bypass path 180 forms an electric connection between the bypass terminal T15 and the transmission path MT1. More specifically, the bypass path 180 forms an electric connection between the bypass terminal T15 and the relay terminal T25 connected to the transmission path MT1. The bypass path 180 includes, for example, a wiring conductor on a printed wiring board provided with the first radio-frequency module 1 and the second radio-frequency module 2. In this case, the communication device 400 includes the printed wiring board as a constituent element thereof.

The control circuit 20 causes the antenna switch 24 to switch between the connections so that one of the duplexer 31, the duplexer 32, the duplexer 33, and the transmission path MT1 is connected to the filter 302 of the diplexer 300.

Frequencies used by the communication device 400 are as follows. The first frequency band in which the first transmission signals lie includes, for example, Band 12 specified by the LTE standard. The second frequency band in which the second transmission signals lie includes, for example, the GSM-1800 frequency band and the GSM-1900 frequency band. The third frequency band in which the third transmission signal lie includes, for example, the GSM-850 frequency band and the GSM-900 frequency band. The fourth frequency band in which the fourth transmission signals lie includes, for example, Band 3 specified by the LTE standard. One of the duplexers 31 to 33 (the duplexer 31) included in the second radio-frequency module 2 supports the 4G or 5G standard and may be provided for Band 3 specified by the LTE standard or for the n8 band specified by the 5G NR. The second radio-frequency module 2 includes a reception path MR1, which is a signal path formed between the antenna switch 24 and the signal output terminal T31. This configuration enables the communication device 400 to support the downlink carrier aggregation for Band 8 and Band 3 or the dual connectivity for the n8 band and Band 3. The duplexer 32 supports the 4G or 5G standard and may be provided for Band 12 specified by the LTE standard. The duplexer 33 supports the 4G or 5G standard and may be provided for Band 20 specified by the LTE standard.

2. Structure of Radio-Frequency Module

Figure 5A:
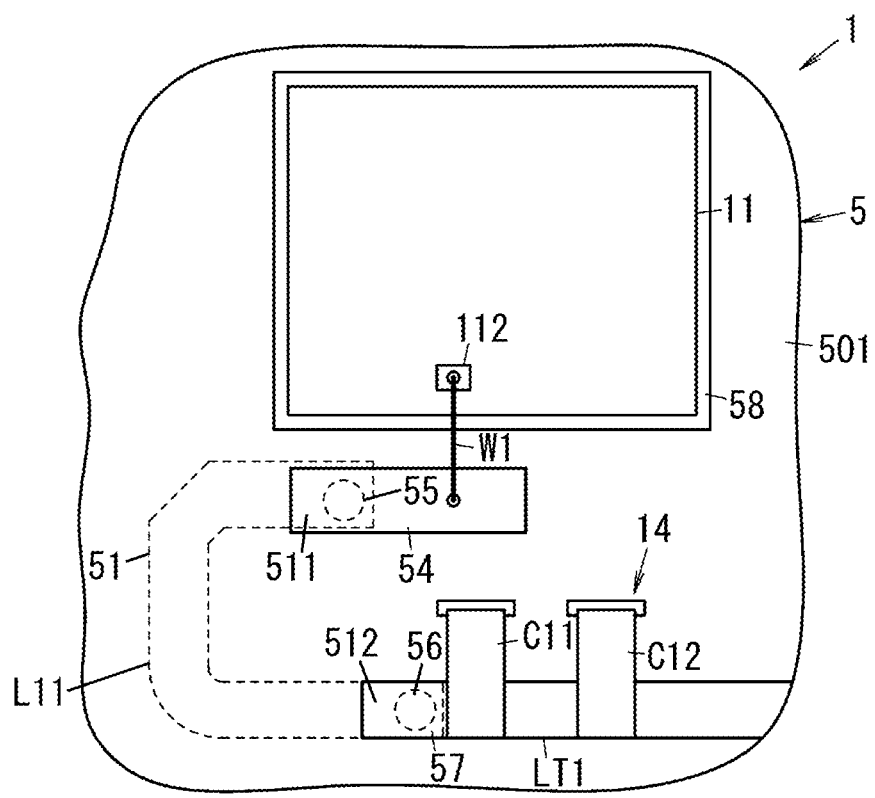
FIG. 5A is a plan view of the radio-frequency module, illustrating the principal part thereof.
Figure 5B:
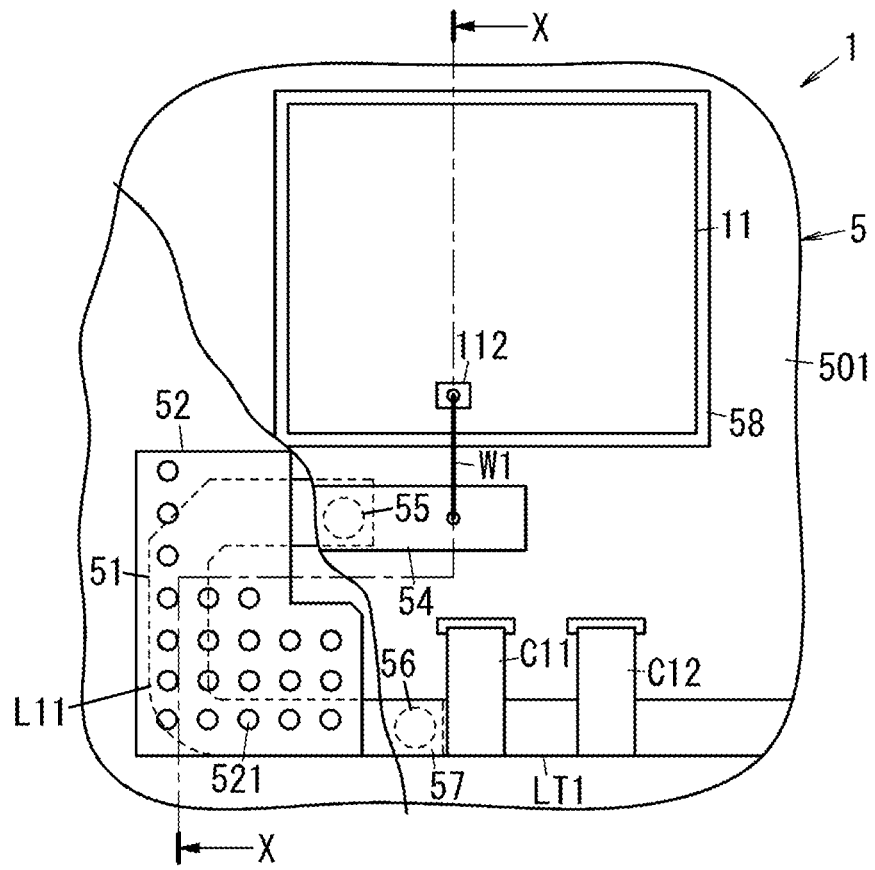
FIG. 5B is a plan view of the radio-frequency module, illustrating the principal part thereof and including a partial cutaway view.
Figure 6:
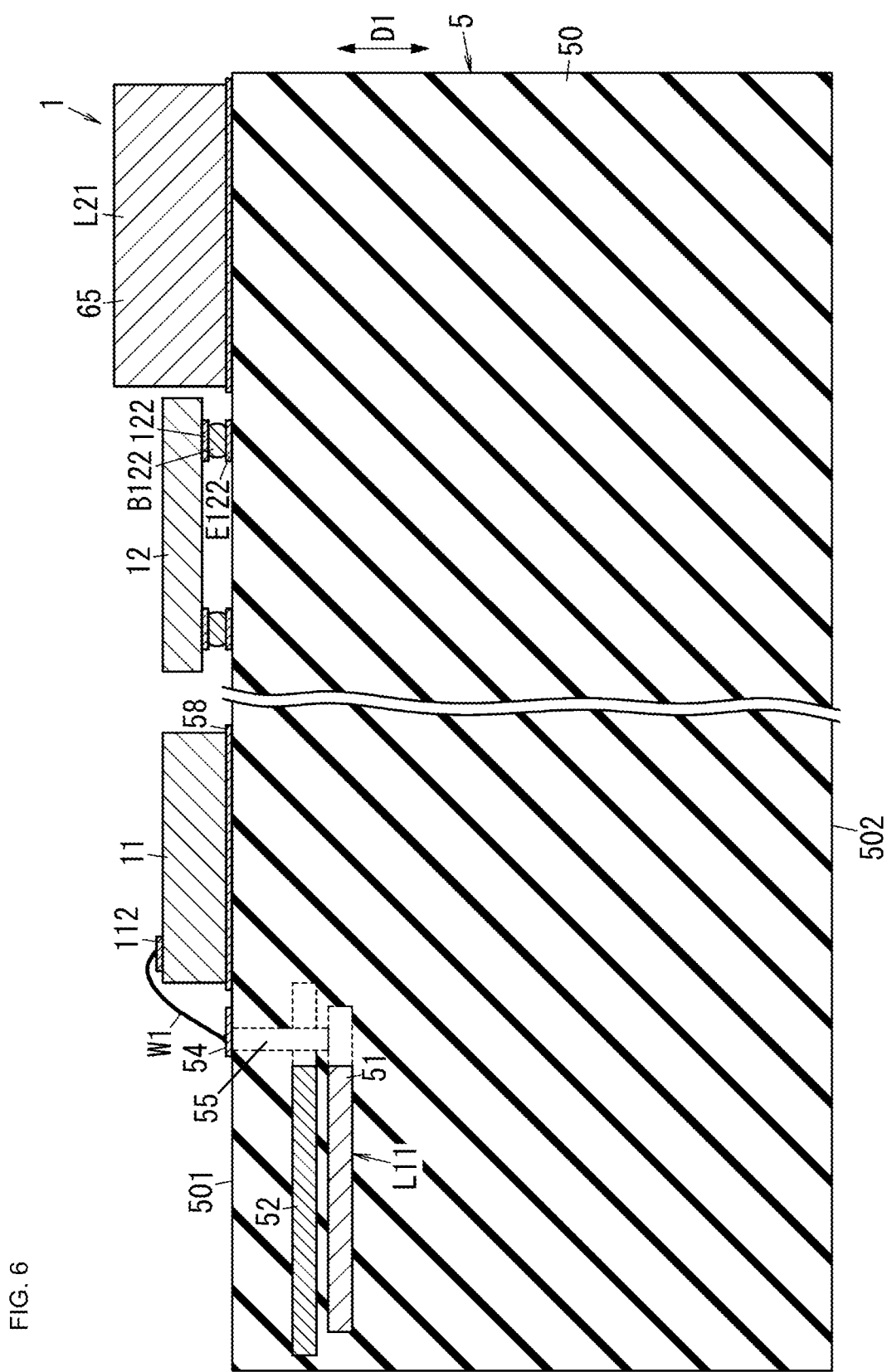
FIG. 6 is a sectional view of the radio-frequency module.

The following describes the structure of the radio-frequency module 1 with reference to FIGS. 1, 5A, 5B, and 6. FIG. 5A is a plan view of the radio-frequency module 1, illustrating the principal part thereof except for a ground layer 52, which will be described later (see FIG. 5B). The left half of FIG. 6 illustrates a section taken along line X-X in FIG. 5B.

As described above, the radio-frequency module 1 includes the first power amplifier 11, the first matching circuit 14, the second power amplifier 12, and the second matching circuit 15. As illustrated in FIGS. 5A, 5B, and 6, the radio-frequency module 1 also includes a multilayer substrate 5. The multilayer substrate 5 is provided at least with the first power amplifier 11, the first matching circuit 14, the second power amplifier 12, and the second matching circuit 15. Each of the first power amplifier 11 and the second power amplifier 12 is a semiconductor chip. The first power amplifier 11 and the second power amplifier 12 are mounted on the multilayer substrate 5.

The radio-frequency module 1 also includes the bypass terminal T15. The radio-frequency module 1 also includes, as described above, the third power amplifier 13 and the third matching circuit 16. The radio-frequency module 1 also includes the antenna terminal T10, the band change-over switch 17, and the antenna switch 19.

The third power amplifier 13 is a semiconductor chip. The band change-over switch 17 is a switching IC. Similarly, the antenna switch 19 is a switching IC. The third power amplifier 13, the band change-over switch 17, and the antenna switch 19 are mounted on the multilayer substrate 5. The IC provided as the control circuit 100 is also mounted on the multilayer substrate 5.

The multilayer substrate 5 has a first main surface 501 and a second main surface 502, which are located on the opposite sides in a thickness direction D1 of the multilayer substrate 5. That is, the multilayer substrate 5 has the first main surface 501 and the second main surface 502, which are located opposite to each other. The first main surface 501 and the second main surface 502 intersect a plane extending in the thickness direction D1 of the multilayer substrate 5. The outer shape of the multilayer substrate 5 viewed in the thickness direction D1 is substantially rectangular.

The multilayer substrate 5 includes a plurality of dielectric layers and a plurality of conductor pattern layers. The dielectric layers and the conductor pattern layers are stacked in the thickness direction D1 of the multilayer substrate 5. The conductor pattern layers are formed into certain patterns. Each of the conductor pattern layers includes one or more conductor portions in a plane orthogonal to the thickness direction D1 of the multilayer substrate 5. The multilayer substrate 5 is, for example, a multilayer ceramic substrate or a printed wiring board and includes a dielectric substrate 50. The dielectric substrate 50 includes a plurality of dielectric layers. The dielectric substrate 50 has electrical insulation properties. The dielectric substrate 50 is in plate form. When viewed in a plan view in the thickness direction D1 of the multilayer substrate 5, the dielectric substrate 50 and the multilayer substrate 5 have substantially rectangular shapes. In some embodiments, the dielectric substrate 50 and the multilayer substrate 5 may have substantially square shapes.

The first power amplifier 11 and the second power amplifier 12 are mounted on the first main surface 501 of the multilayer substrate 5. The first power amplifier 11 is disposed on a die pad 58 of the multilayer substrate 5. The surface of the die pad 58 opposite to the dielectric substrate 50 is a part of the first main surface 501. The die pad 58 has electrical conductivity.

The first inductor portion L11 in the first matching circuit 14 in the radio-frequency module 1 includes an inner-layer inductor portion 51, which is located in (provided as an inner layer of) the multilayer substrate 5. The inner-layer inductor portion 51 is located between the first main surface 501 and the second main surface 502 of the multilayer substrate 5 and is located away from the first main surface 501 and the second main surface 502. The inner-layer inductor portion 51 is made of a conductive material. The first inductor portion L11 in the first matching circuit 14 is the series inductor portion being located on the signal path LT1 connected to the output pad electrode 112 of the first power amplifier 11 and being closer than the other first inductor portions (L12 to L16) on the signal path LT1 to the output pad electrode 112. The expression "closer than the other first inductor portions to the output pad electrode 112" herein means being circuit-wise closer than the other first inductor portions to the output pad electrode 112.

The first inductor portion L11 includes, in addition to the inner-layer inductor portion 51, a bonding wire W1, a conductor portion 54, a via conductor 55, a via conductor 56, and part of a conductor portion 57. The part of the conductor portion 57 included in the first inductor portion L11 extends, for example, from the junction of the conductor portion 57 and the via conductor 56 to the node N11 connected with the capacitor C11. The node N11 on the signal path LT1 connected to the output pad electrode 112 of the first power amplifier 11 is circuit-wise closer than the other nodes (N12 to N14) on the signal path LT1 to the output pad electrode 112. In the radio-frequency module 1 according to Embodiment 1, the first inductor portion L11 is circuit-wise closer than the node N11 to the output pad electrode 112 of the first power amplifier 11.

The inner-layer inductor portion 51, the conductor portion 54, the via conductor 55, the via conductor 56, and the conductor portion 57 are made of the same material. In some embodiments, the inner-layer inductor portion 51 may be made of a different material.

The inner-layer inductor portion 51 is, for example, substantially C-shaped when viewed in plan in the thickness direction D1 of the multilayer substrate 5. The inner-layer inductor portion 51 has a first end 511 and a second end 512. Referring to FIGS. 5A and 5B, the inner-layer inductor portion 51 has less than one turn. In some embodiments, the inner-layer inductor portion 51 may have one or more turns. The inner-layer inductor portion 51 may be in the form of a three-dimensional spiral. Alternatively, the inner-layer inductor portion 51 may be in the form of a two-dimensional spiral (may be scroll-shaped when viewed in a plan view in the thickness direction D1 of the multilayer substrate 5). Still alternatively, the inner-layer inductor portion 51 may have a meander-like shape when viewed in a plan view in the thickness direction D1 of the multilayer substrate 5.

The bonding wire W1 is a (small-gage metal) wire that forms a connection between the output pad electrode 112 of the first power amplifier 11 and the conductor portion 54 on the first main surface 501 of the multilayer substrate 5. The bonding wire W1 is made of, for example, gold, an aluminum alloy, or copper.

The conductor portion 54 and the die pad 58 are adjacent to each other on the first main surface 501 of the multilayer substrate 5.

The via conductor 55 is substantially pillar-shaped, or more specifically, substantially cylindrical as illustrated in FIGS. 5A, 5B, and 6. The via conductor 55 overlaps the conductor portion 54 and the first end 511 of the inner-layer inductor portion 51 when viewed in a plan view in the thickness direction D1 of the multilayer substrate 5. The via conductor 55 is disposed between the conductor portion 54 and the first end 511 of the inner-layer inductor portion 51 and is electrically connected to the conductor portion 54 and to the first end 511 of the inner-layer inductor portion 51.

The via conductor 56 overlaps the conductor portion 57 and the second end 512 of the inner-layer inductor portion 51 when viewed in a plan view in the thickness direction D1 of the multilayer substrate 5. The via conductor 56 is disposed between the conductor portion 57 and the second end 512 of the inner-layer inductor portion 51 and is electrically connected to the conductor portion 57 and to the second end 512 of the inner-layer inductor portion 51.

The conductor portion 57 is located opposite to first power amplifier 11 with the conductor portion 54 therebetween. The conductor portion 57 is located away from the conductor portion 54.

The first inductor portions L12 to L16 in the first matching circuit 14 illustrated in FIG. 2 are mounted on the first main surface 501 of the multilayer substrate 5. In some embodiments, the first inductor portions L12 to L16 may be located in the multilayer substrate 5. The first inductor portions L12 to L16 in the first matching circuit 14 include, for example, their respective chip inductors mounted on the first main surface 501 of the multilayer substrate 5. Unlike the first inductor portions L12 to L16, the first inductor portion L11 includes neither a chip inductor nor other electronic components mounted on the multilayer substrate 5.

The capacitors C11 to C14 in the first matching circuit 14 are, for example, chip capacitors and are mounted on the first main surface 501 of the multilayer substrate 5.

The second power amplifier 12 in the radio-frequency module 1 is mounted on the first main surface 501 of the multilayer substrate 5. More specifically, the second power amplifier 12 is mounted on the multilayer substrate 5 by flip-chip mounting. The output pad electrode 122 of the second power amplifier 12 is connected to a land E122 of the multilayer substrate 5 via a bump B122. The B122 has electrical conductivity. The bump B122 is made of, for example, Au, Cu, or solder.

The second inductor portions L21 to L26 in the second matching circuit 15 illustrated in FIG. 3 are mounted on the first main surface 501 of the multilayer substrate 5. The second inductor portion L21 in the second matching circuit 15 includes, for example, a chip inductor 65, which is mounted on the first main surface 501 of the multilayer substrate 5. The second inductor portions L22 to L26 in the second matching circuit 15 include, for example, their respective chip inductors mounted on the first main surface 501 of the multilayer substrate 5. The capacitors C21 to C25 in the second matching circuit 15 are, for example, chip capacitors and are mounted on the first main surface 501 of the multilayer substrate 5.

The second inductor portion L21 in the second matching circuit 15 is located across the second power amplifier 12 from the first inductor portion L11 in first matching circuit 14 when viewed in a plan view in the thickness direction D1 of the multilayer substrate 5. The second inductor portion L21 in the second matching circuit 15 is the series inductor portion being located on the signal path LT2 connected to the output pad electrode 122 of the second power amplifier 12 and being closer than the other second inductor portions (L22 to L26) on the signal path LT2 to the output pad electrode 122. The expression "closer than the other second inductor portions to the output pad electrode 122" herein means being circuit-wise closer than the other second inductor portions to the output pad electrode 122.

The third inductor portions in the third matching circuit 16 include, for example, their respective chip inductors. The capacitors in the third matching circuit 16 are, for example, chip capacitors. The third inductor portions and the capacitors in the third matching circuit 16 are mounted on the multilayer substrate 5.

The multilayer substrate 5 includes the ground layer 52 (see FIGS. 5B and 6). The ground layer 52 is located between the first main surface 501 and the second main surface 502 and is located away from the first main surface 501 and the second main surface 502. The ground layer 52 at least partially overlaps the inner-layer inductor portion 51 when viewed in a plan view in the thickness direction D1 of the multilayer substrate 5. Referring to FIG. 5B, the ground layer 52 overlaps the inner-layer inductor portion 51 substantially along the entire length of the inner-layer inductor portion 51 when viewed in a plan view in the thickness direction D1 of the multilayer substrate 5. For example, one of the conductor pattern layers is formed into the ground layer 52.

The ground layer 52 extends beyond the inner-layer inductor portion 51 when viewed in a plan view in the thickness direction D1 of the multilayer substrate 5. The inner-layer inductor portion 51 is located on the inner side with respect to the periphery of the ground layer 52 when viewed in a plan view in the thickness direction D1 of the multilayer substrate 5.

The ground layer 52 between the first main surface 501 and the second main surface 502 is located closer than the inner-layer inductor portion 51 to the first main surface 501, on which the second power amplifier 12 is mounted. In the thickness direction D1 of the multilayer substrate 5, the distance between the first main surface 501 and the surface of the ground layer 52 facing the inner-layer inductor portion 51 is thus shorter than the shortest distance between the first main surface 501 and the inner-layer inductor portion 51.

The ground layer 52 is electrically connected to the die pad 58 via, for example, a via conductor (not illustrated). The ground layer 52 may be a conductor portion that is at ground potential during, for example, periods of use of the radio-frequency module 1.

The ground layer 52 has a plurality of holes 521 (see FIG. 5B), which are through-holes extending in the thickness direction D1 of the multilayer substrate 5. This configuration may suppress the capacitive coupling between the ground layer 52 and the conductor portion (including the inner-layer inductor portion 51) in the multilayer substrate 5. The holes 521 are substantially circular openings. The inside diameter of each of the holes 521 is smaller than the line width of the inner-layer inductor portion 51. The inside diameter of each of the holes 521 may be determined as appropriate, for example, at the design stage in accordance with the frequency of the first transmission signals. The inside diameter may be greater when the frequency of the first transmission signals is lower. In some embodiments, the holes 521 may be substantially polygonal openings.

In the thickness direction D1 of the multilayer substrate 5, the ground layer 52 is located between the inner-layer inductor portion 51 included in the first inductor portion L11 and the chip inductor 65 included in the second inductor portion L21. The ground layer 52 at least partially overlaps the inner-layer inductor portion 51 when viewed in plan in the thickness direction D1. The second inductor portion L21 in the second matching circuit 15 is located on the signal path LT2 and is closer than the other second inductor portions (L22 to L26) on the signal path LT2 to the output pad electrode 122 of the second power amplifier 12. The signal path LT2 is connected to the output pad electrode 122 of the second power amplifier 12.

The distance between the ground layer 52 and the inner-layer inductor portion 51 in the radio-frequency module 1 is shorter than the distance between the ground layer 52 and the second inductor portion L21 in the second matching circuit 15.

When the radio-frequency module 1 is viewed in a plan view in the thickness direction D1 of the multilayer substrate 5, the first inductor portion L11 including the bonding wire W1 is located across the first power amplifier 11 from the second power amplifier 12 and the second inductor portion L21.

The antenna terminal T10, the signal input terminals T11 to T13, the bypass terminal T15, and the signal output terminals T81 to T83 in the radio-frequency module 1 are external connection terminals that are provided on the second main surface 502 of the multilayer substrate 5 in such a manner as to protrude from the multilayer substrate 5. Similarly, ground terminals included in the radio-frequency module 1 and connected to the ground layer 52 via, for example, via conductors are external connection terminals that are provided on the second main surface 502 of the multilayer substrate 5 in such a manner as to protrude from the multilayer substrate 5.

The radio-frequency module 1 may also include a cover layer that is provided on the first main surface 501 of the multilayer substrate 5 in such a manner as to cover electronic components mounted on the multilayer substrate 5. The cover layer may cover electronic components such as the first power amplifier 11, the second power amplifier 12, and the second inductor portion L21 in the second matching circuit 15. The cover layer may also cover electronic components such as the third power amplifier 13, the first inductor portions L12 to L16 and the capacitors C11 to C14 in the first matching circuit 14, the second inductor portions L22 to L26 and the capacitors C21 to C25 in the second matching circuit 15, the third inductor portions and the capacitors in the third matching circuit 16, the duplexers 81 to 83, the antenna switch 19, the band change-over switch 17, and the control circuit 100.

The cover layer has electrical insulation properties. The electronic components are sealed in the cover layer. The bonding wire W1 is also sealed in the cover layer. The cover layer is made of, for example, an insulating resin such as an epoxy resin.

The radio-frequency module 1 according to Embodiment 1 may also include a shield layer that covers the cover layer. The shield layer is made of, for example, metal.

3. Effects

There is a demand for a radio-frequency module in which a power amplifier (a first power amplifier) for the low band specified by the 4G standard and a power amplifier (a second power amplifier) for the midband specified by the 2G standard are included and may be used at the same time.

There is also a demand for a radio-frequency module in which a power amplifier for the low band specified by the 4G standard and a low-noise amplifier for the midband specified by the 2G standard are included and may be used at the same time.

The disadvantage of such a radio-frequency module is that when the frequency of a double wave that is one of the harmonic waves of transmission signals overlaps the second frequency band, (unwanted radiation of) the harmonic wave may hop onto a signal path provided for the second frequency band. When Band 12 as the low band spectrum specified by the 4G standard (the first frequency band) and Band 4 as the midband spectrum specified by the 2G standard (the second frequency band) are used at the same time, the frequency of a double wave that is one of the harmonic waves of transmission signals in Band 12 overlaps the second frequency band, and (unwanted radiation of) the harmonic wave may thus hop onto the signal path provided for the second frequency band. The signal path may be connected with the low-noise amplifier. In this case, the reception performance of the receiving circuit including the low-noise amplifier would degrade accordingly.

The radio-frequency module 1 according to Embodiment 1 is configured as follows. The first power amplifier 11 amplifies the first transmission signals in the first frequency band and outputs the resultant signals from the output pad electrode 112. The first matching circuit 14 includes the first inductor portions L11 to L16 and is connected to the output pad electrode 112 of the first power amplifier 11. The second power amplifier 12 amplifies the second transmission signals in the second frequency band higher than the first frequency band and outputs the resultant signals. The second matching circuit 15 includes at least one second inductor portion (e.g., the second inductor portion L21) and is connected to the output side of the second power amplifier 12 (the output pad electrode 122 of the second power amplifier 12). The multilayer substrate 5 is provided with the first power amplifier 11, the first matching circuit 14, the second power amplifier 12, and the second matching circuit 15. The first inductor portion L11 closer than the other first inductor portions (L12 to L16) in the first matching circuit 14 to the output pad electrode 112 of the first power amplifier 11 includes the inner-layer inductor portion 51, which is located in (provided as an inner layer of) the multilayer substrate 5.

The radio-frequency module 1 according to Embodiment 1 is capable of suppressing (magnetic) coupling between the first inductor portion L11 in the first matching circuit 14 and the second inductor portion L21 in the second matching circuit 15.

The radio-frequency module 1 according to Embodiment 1 is capable of eliminating or reducing the possibility that unwanted radiation on the output side of the first power amplifier 11, which is the power amplifier for the low band specified by the 4G or 5G standard, will hop onto the output side of the second power amplifier 12, which is the power amplifier for the midband specified by the 2G standard. More specifically, the radio-frequency module 1 according to Embodiment 1 is capable of eliminating or reducing the possibility that during transmission of the first transmission signals in, for example, Band 12 through the first power amplifier 11 provided for the low band specified by the 4G or 5G standard, unwanted radiation (the harmonic wave of the first transmission signals) from the first inductor portion L11 in the first matching circuit 14 will leap into the second inductor portion L21 included in the second matching circuit 15 and located on the output side of the second power amplifier 12, which is provided for the midband specified by the 2G standard. In other words, the radio-frequency module 1 is capable of eliminating or reducing the possibility that magnetic coupling between the first inductor portion L11 in the first matching circuit 14 and the second inductor portion L21 in the second matching circuit 15 will cause hopping of unwanted radiation.

In the radio-frequency module 1 according to Embodiment 1, the second inductor portion L21 includes the chip inductor 65, which is mounted on the first main surface 501 or the second main surface 502 of the multilayer substrate 5. The multilayer substrate 5 includes the ground layer 52, which is located between the inner-layer inductor portion 51 and the chip inductor 65 in the thickness direction D1 of the multilayer substrate 5. The ground layer 52 at least partially overlaps the inner-layer inductor portion 51 when viewed in a plan view in the thickness direction D1. The radio-frequency module 1 according to Embodiment 1 is thus capable of eliminating or reducing the possibility that unwanted radiation (the harmonic wave of the first transmission signals) from the inner-layer inductor portion 51 will hop onto the at least one second inductor portion (e.g., the second inductor portion L21) in the second matching circuit 15.

When the radio-frequency module 1 according to Embodiment 1 is viewed in a plan view in the thickness direction D1 of the multilayer substrate 5, the first inductor portion L11 including the bonding wire W1 is located across the first power amplifier 11 from the second power amplifier 12 and the second inductor portion L21. This layout of the radio-frequency module 1 according to Embodiment 1 hinders unwanted radiation from the bonding wire W1 connected to the output pad electrode 112 of the first power amplifier 11 from reaching the second inductor portion L21 in the second matching circuit 15.

The radio-frequency module 1 according to Embodiment 1 also includes the bypass terminal T15. The bypass terminal T15 is connected to the second power amplifier 12 via the second matching circuit 15 to output the second transmission signals from the second power amplifier 12 to an outside of the radio-frequency module 1 (to the second radio-frequency module 2). The radio-frequency module 1 according to Embodiment 1 is thus capable of eliminating or reducing the possibility that the reception performance of the duplexer located on the reception path MR1 to receive signals in the second frequency band and the reception performance of, for example, a receiving circuit including a low-noise amplifier connected to the reception path MR1 will degrade in the second radio-frequency module 2.

The radio-frequency module 1 according to Embodiment 1 also includes the antenna switch 19 and the receiving filters. The antenna switch 19 is disposed between the antenna terminal T10 and the output terminal 112 of the first power amplifier 11 and between the antenna terminal T10 and the output terminal 132 of the third power amplifier 13. The receiving filters are disposed between the antenna switch 19 and the first matching circuit 14 and are provided for the low band specified by the 4G or 5G standard. The receiving filters thus allow the reception signals in first frequency band specified by the 4G to 5G to pass therethrough. When the communication device 400 according to Embodiment 1 performs simultaneous communication in Band 12 and Band 3 (e.g., two-downlink carrier aggregation), this configuration eliminates or reduces the possibility that the harmonic wave in Band 12 will flow into the duplexer 31 in the second radio-frequency module 2 via the bypass terminal T15. This provides the improved communication performance. In some embodiments, the simultaneous communication may involve, in place of carrier aggregation, dual connectivity. Band combinations for dual connectivity include a combination of n8 (Band 8) and Band 3 and a combination of n28 (Band 28) and Band 1.

The communication device 400 transmits signals in the midband specified by the 2G standard and receives signals in the midband specified by the 4G or 5G standard but does not do both at the same time.

Embodiment 2

Figure 7:
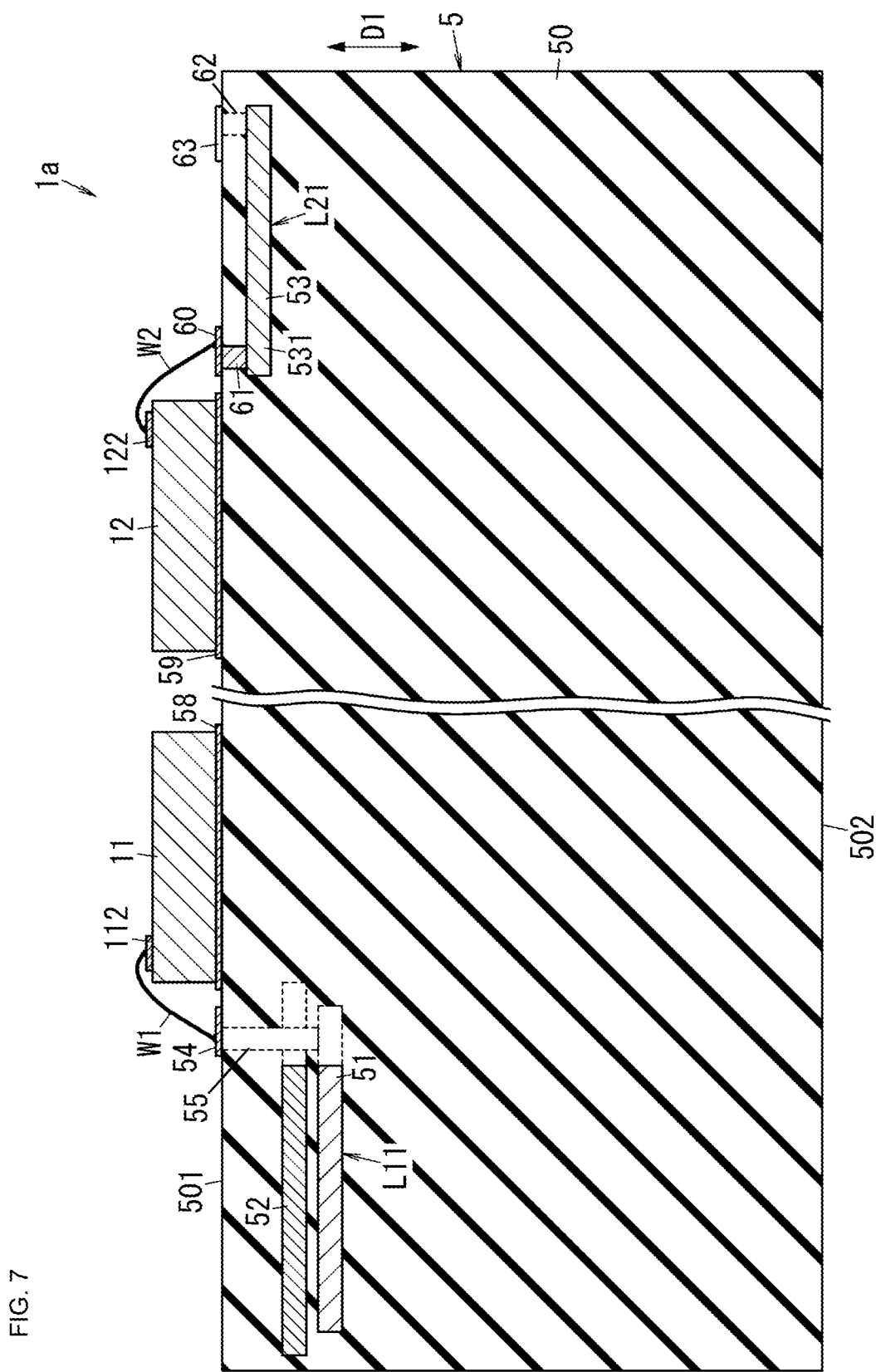
FIG. 7 is a sectional view of a radio-frequency module according to Embodiment 2.

The following describes a radio-frequency module 1a according to Embodiment 2 with reference to FIG. 7. Constituent elements of the radio-frequency module 1a according to Embodiment 2 that are similar to the corresponding constituent elements of the radio-frequency module 1 according to Embodiment 1 are denoted by the same reference signs, and a redundant description thereof will be omitted.

In the radio-frequency module 1a according to Embodiment 2, the second power amplifier 12 is disposed on a die pad 59 of the multilayer substrate 5. The surface of the die pad 59 opposite to the dielectric substrate 50 is a part of the first main surface 501. The die pad 59 has electrical conductivity.

The second inductor portion L21 in the second matching circuit 15 in the radio-frequency module 1a includes a second inner-layer inductor portion 53, which is located in (provided as an inner layer of) the multilayer substrate 5. The second inner-layer inductor portion 53 is located between the first main surface 501 and the second main surface 502 of the multilayer substrate 5 and is located away from the first main surface 501 and the second main surface 502. The second inner-layer inductor portion 53 is made of a conductive material. The second inductor portion L21 in the second matching circuit 15 is the series inductor portion being located on the signal path LT2 connected to the output pad electrode 122 of the second power amplifier 12 and being closer than the other second inductor portions (L22 to L26) on the signal path LT2 to the output pad electrode 122.

The second inductor portion L21 includes, in addition to the second inner-layer inductor portion 53, a bonding wire W2, a conductor portion 60, a via conductor 61, a via conductor 62, and part of a conductor portion 63. The part of the conductor portion 63 included in the second inductor portion L21 extends, for example, from the junction of the conductor portion 63 and the via conductor 62 to the node N21 connected with the capacitor C22 (see FIG. 3). The node N21 is located on the signal path LT2 connected to the output pad electrode 122 of the second power amplifier 12 and is circuit-wise closer than the other nodes (N22 to N24) on the signal path LT2 to the output pad electrode 122. In the radio-frequency module 1a according to Embodiment 2, the second inductor portion L21 is circuit-wise closer than the node N21 to the output pad electrode 122 of the second power amplifier 12.

The second inner-layer inductor portion 53, the conductor portion 60, the via conductor 61, the via conductor 62, and the conductor portion 63 are made of the same material. In some embodiments, the second inner-layer inductor portion 53 may be made of a different material.

The second inner-layer inductor portion 53 is, for example, scroll-shaped (in the form of a two-dimensional spiral) when viewed in a plan view in the thickness direction D1 of the multilayer substrate 5. The second inner-layer inductor portion 53 has a first end 531 and a second end. Alternatively, the second inner-layer inductor portion 53 may be substantially C-shaped or may have a meander-like shape when viewed in a plan view in the thickness direction D1 of the multilayer substrate 5. Still alternatively, the second inner-layer inductor portion 53 may be in the form of a three-dimensional spiral.

The bonding wire W2 is a (small-gage metal) wire that forms a connection between the output pad electrode 122 of the second power amplifier 12 and the conductor portion 60 on the first main surface 501 of the multilayer substrate 5. The bonding wire W2 is made of, for example, gold, an aluminum alloy, or copper.

The conductor portion 60 and the die pad 59 are adjacent to each other on the first main surface 501 of the multilayer substrate 5.

The via conductor 61 is substantially pillar-shaped, or more specifically, substantially cylindrical as illustrated in FIG. 7. The via conductor 61 overlaps the conductor portion 60 and the first end 531 of the second inner-layer inductor portion 53 when viewed in a plan view in the thickness direction D1 of the multilayer substrate 5. The via conductor 61 is disposed between the conductor portion 60 and the first end 531 of the second inner-layer inductor portion 53 and is electrically connected to the conductor portion 60 and to the first end 531 of the second inner-layer inductor portion 53.

The via conductor 62 overlaps the conductor portion 63 and the second end of the second inner-layer inductor portion 53 when viewed in a plan view in the thickness direction D1 of the multilayer substrate 5. The via conductor 62 is disposed between the conductor portion 63 and the second end of the second inner-layer inductor portion 53 and is electrically connected to the conductor portion 63 and to the second end of the second inner-layer inductor portion 53.

The conductor portion 63 is located opposite to second power amplifier 12 with the conductor portion 60 therebetween. The conductor portion 63 is located away from the conductor portion 60.

As with the radio-frequency module 1 according to Embodiment 1, the radio-frequency module 1a according to Embodiment 2 is capable of suppressing (magnetic) coupling between the first inductor portion L11 in the first matching circuit 14 and the second inductor portion L21 in the second matching circuit 15. More specifically, the radio-frequency module 1a according to Embodiment 2 is capable of eliminating or reducing the possibility that unwanted radiation on the output side of the first power amplifier 11, which is the power amplifier for the low band specified by the 4G or 5G standard, will hop onto the output side of the second power amplifier 12, which is the power amplifier for the midband specified by the 2G standard. The communication device 400 according to Embodiment 1 may include the radio-frequency module 1a in place of the first radio-frequency module 1.

The second inductor portion L21 in the radio-frequency module 1a according to Embodiment 2 includes the second inner-layer inductor portion 53, which is located in (provided as an inner layer of) the multilayer substrate 5 and is discretely located away from a first inner-layer inductor portion, which is the inner-layer inductor portion 51 in the first matching circuit 14. The first inner-layer inductor portion (the inner-layer inductor portion 51) and the second inner-layer inductor portion 53 are in different positions in the thickness direction D1 of the multilayer substrate 5. In the thickness direction D1 of the multilayer substrate 5 of the radio-frequency module 1a according to Embodiment 2, the ground layer 52 is located between the first inner-layer inductor portion (the inner-layer inductor portion 51) and the second inner-layer inductor portion 53. The ground layer 52 at least partially overlaps the first inner-layer inductor portion (the inner-layer inductor portion 51) when viewed in a plan view in the thickness direction D1. The radio-frequency module 1a according to Embodiment 2 is thus capable of eliminating or reducing the possibility that unwanted radiation (the harmonic wave of the first transmission signals) from the first inner-layer inductor portion (the inner-layer inductor portion 51) in the first matching circuit 14 will hop onto the second inner-layer inductor portion 53 included in the at least one second inductor portion (the second inductor portion L21) in the second matching circuit 15.

Embodiment 3

Figure 8:
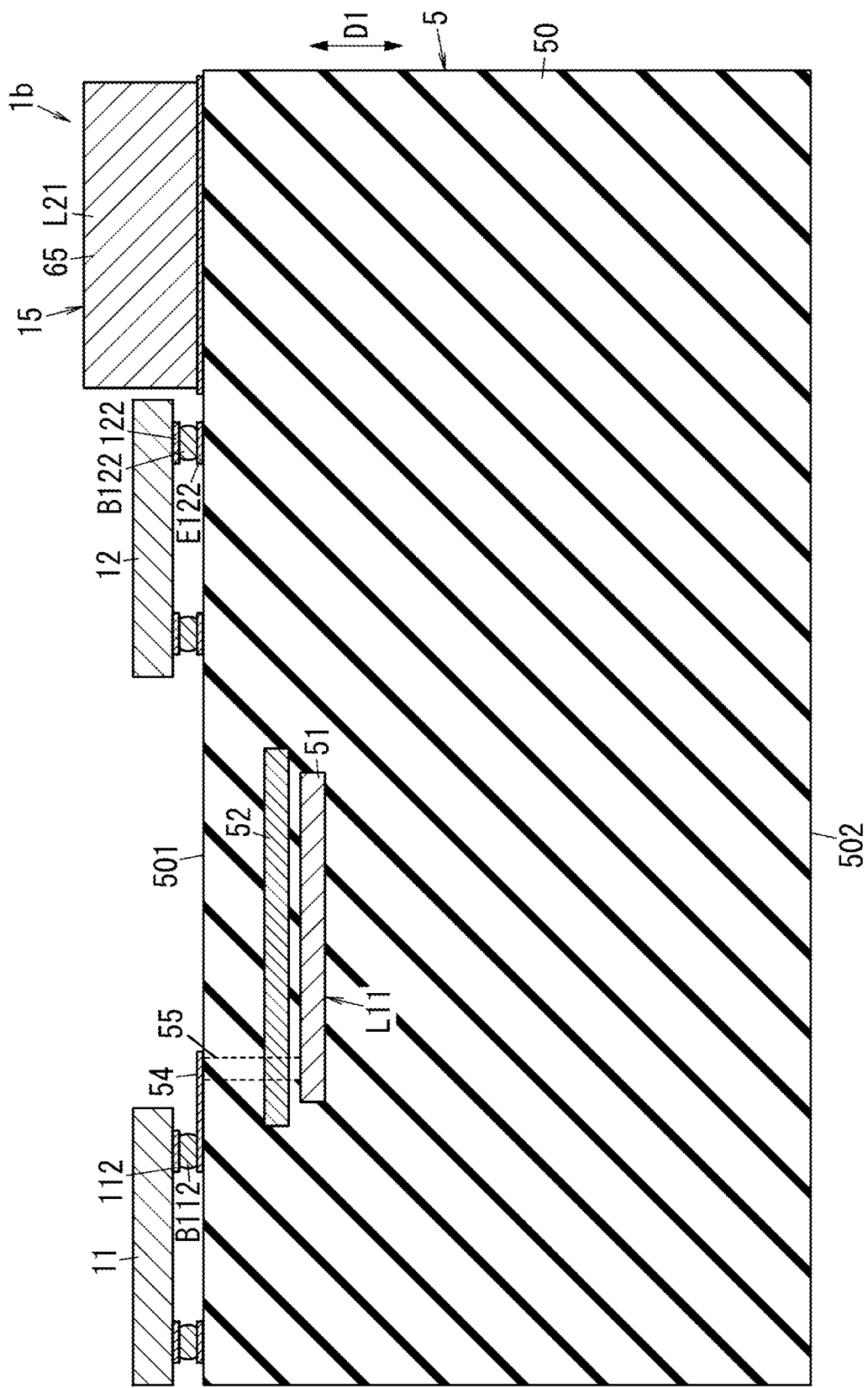
FIG. 8 is a sectional view of a radio-frequency module according to Embodiment 3.

The following describes a radio-frequency module 1b according to Embodiment 3 with reference to FIG. 8. Constituent elements of the radio-frequency module 1b according to Embodiment 3 that are similar to the corresponding constituent elements of the radio-frequency module 1 according to Embodiment 1 are denoted by the same reference signs, and a redundant description thereof will be omitted.

The radio-frequency module 1b according to Embodiment 3 differs from the radio-frequency module 1 according to Embodiment 1 in that the first power amplifier 11 is mounted on the multilayer substrate 5 by flip-chip mounting.

The output pad electrode 112 of the first power amplifier 11 in the radio-frequency module 1b according to Embodiment 3 is connected to the conductor portion 54 on the first main surface 501 of the multilayer substrate 5 via a bump B112. The B112 has electrical conductivity. The bump B112 is made of, for example, Au, Cu, or solder.

The bonding wire W1 in the first matching circuit 14 in the radio-frequency module 1 according to Embodiment 1 is replaced with the bump B112 of the first inductor portion L11 in the first matching circuit 14 in the radio-frequency module 1b according to Embodiment 3. That is, the first inductor portion L11 in the radio-frequency module 1b according to Embodiment 3 includes the bump B112 as well as the inner-layer inductor portion 51, the conductor portion 54, the via conductor 55, the via conductor 56, and part of the conductor portion 57.

As with the radio-frequency module 1 according to Embodiment 1, the radio-frequency module 1b according to Embodiment 3 is capable of suppressing (magnetic) coupling between the first inductor portion L11 in the first matching circuit 14 and the second inductor portion L21 in the second matching circuit 15. More specifically, the radio-frequency module 1b according to Embodiment 3 is capable of eliminating or reducing the possibility that unwanted radiation on the output side of the first power amplifier 11, which is the power amplifier for the low band specified by the 4G or 5G standard, will hop onto the output side of the second power amplifier 12, which is the power amplifier for the midband specified by the 2G standard. The communication device 400 according to Embodiment 1 may include the radio-frequency module 1b in place of the first radio-frequency module 1.

When the radio-frequency module 1b according to Embodiment 3 is viewed in a plan view in the thickness direction D1 of the multilayer substrate 5, the ground layer 52 is located between the first power amplifier 11 and the second power amplifier 12. With the multilayer substrate 5 being viewed in a plan view, the radio-frequency module 1b according to Embodiment 3 is thus more compact than the radio-frequency module 1 according to Embodiment 1. Unlike the radio-frequency module 1 according to Embodiment 1, the radio-frequency module 1b according to Embodiment 3 eliminates the need to include the bonding wire W1 and enables a profile reduction in the thickness direction D1 of the multilayer substrate 5 accordingly.

Embodiment 4

Figure 9:
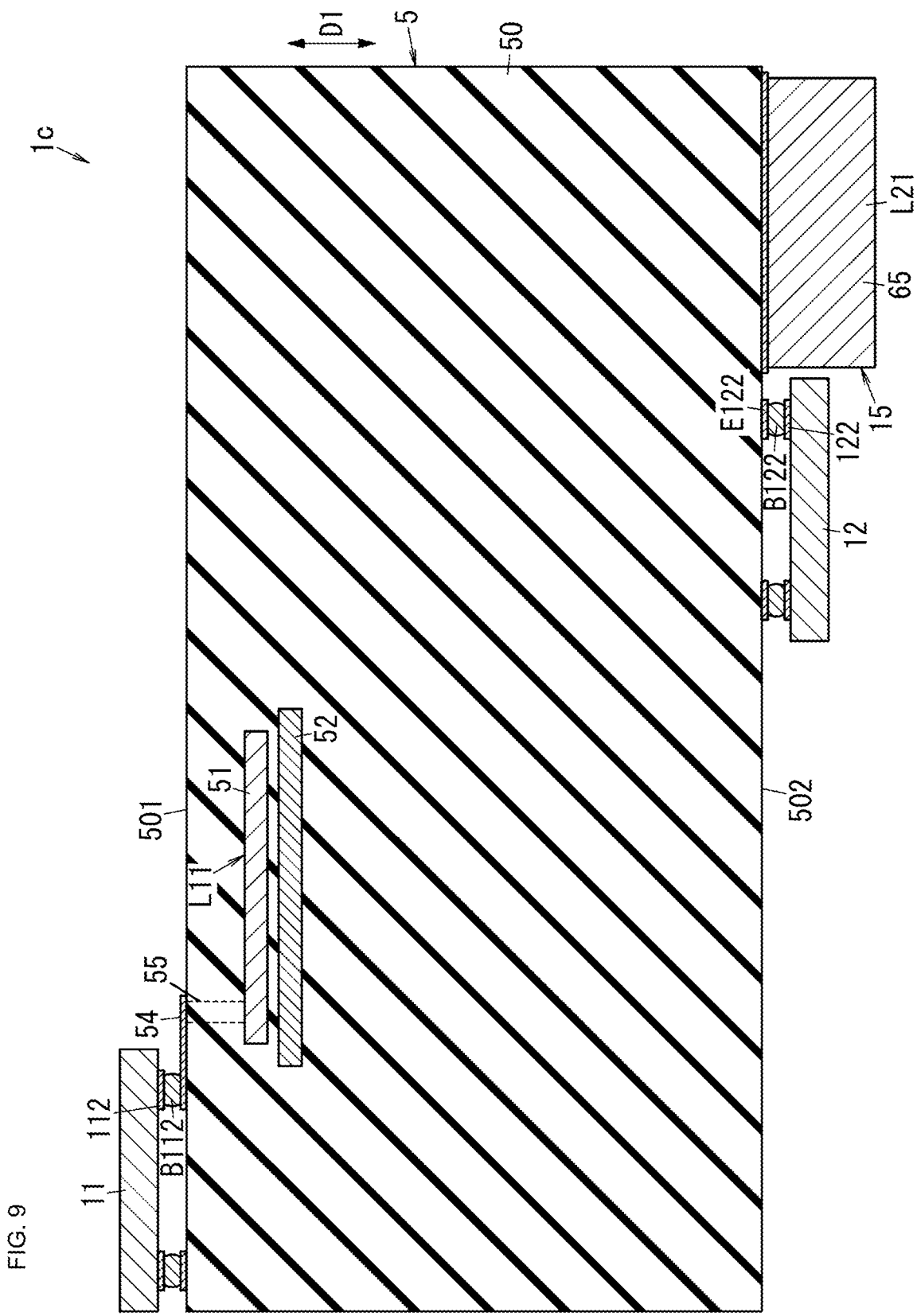
FIG. 9 is a sectional view of a radio-frequency module according to Embodiment 4.

The following describes a radio-frequency module 1c according to Embodiment 4 with reference to FIG. 9. Constituent elements of the radio-frequency module 1c according to Embodiment 4 that are similar to the corresponding constituent elements of the radio-frequency module 1b according to Embodiment 3 are denoted by the same reference signs, and a redundant description thereof will be omitted.

The radio-frequency module 1c according to Embodiment 4 differs from the radio-frequency module 1b according to Embodiment 3 in that the second power amplifier 12 is mounted on the second main surface 502 of the multilayer substrate 5. In the radio-frequency module 1c according to Embodiment 4, the first power amplifier 11 is mounted on the first main surface 501 of the multilayer substrate 5, whereas the second power amplifier 12 is mounted on the second main surface 502 of the multilayer substrate 5.

The ground layer 52 between the first main surface 501 and the second main surface 502 is located closer than the inner-layer inductor portion 51 to the second main surface 502, on which the second power amplifier 12 is mounted. In the thickness direction D1 of the multilayer substrate 5, the distance between the second main surface 502 and the surface of the ground layer 52 facing the inner-layer inductor portion 51 is thus shorter than the shortest distance between the second main surface 502 and the inner-layer inductor portion 51.

As with the radio-frequency module 1b according to Embodiment 3, the radio-frequency module 1c according to Embodiment 4 is capable of suppressing the (magnetic) coupling between the first inductor portion L11 in the first matching circuit 14 and the second inductor portion L21 in the second matching circuit 15. More specifically, the radio-frequency module 1c according to Embodiment 4 is capable of eliminating or reducing the possibility that unwanted radiation on the output side of the first power amplifier 11, which is the power amplifier for the low band specified by the 4G or 5G standard, will hop onto the output side of the second power amplifier 12, which is the power amplifier for the midband specified by the 2G standard. The communication device 400 according to Embodiment 1 may include the radio-frequency module 1c in place of the radio-frequency module 1.

Embodiment 5

Figure 10:
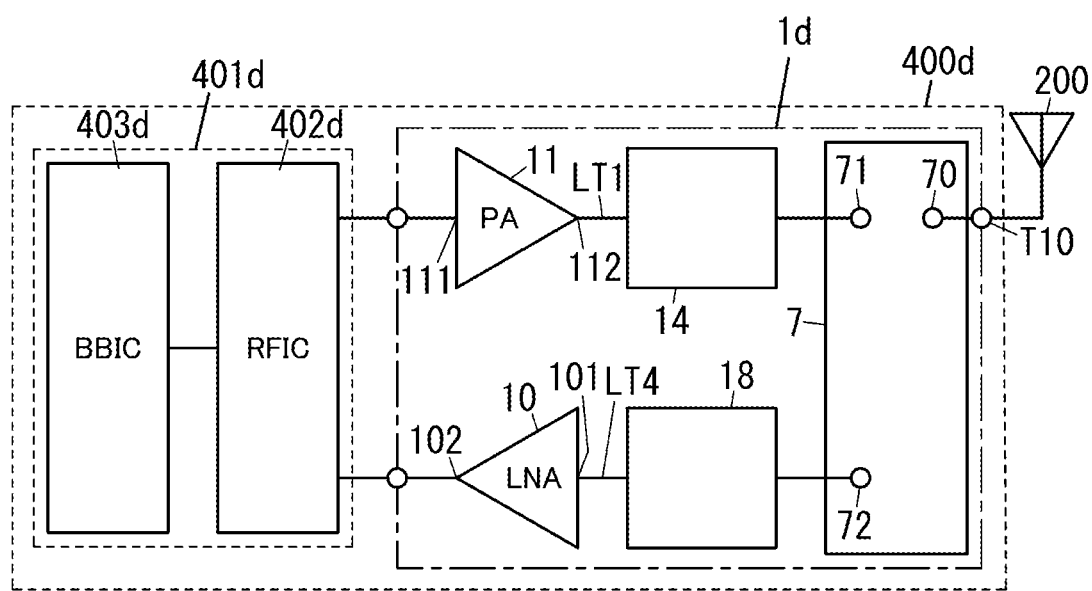
FIG. 10 is a circuit diagram of a communication device including a radio-frequency module according to Embodiment 5.
Figure 11:
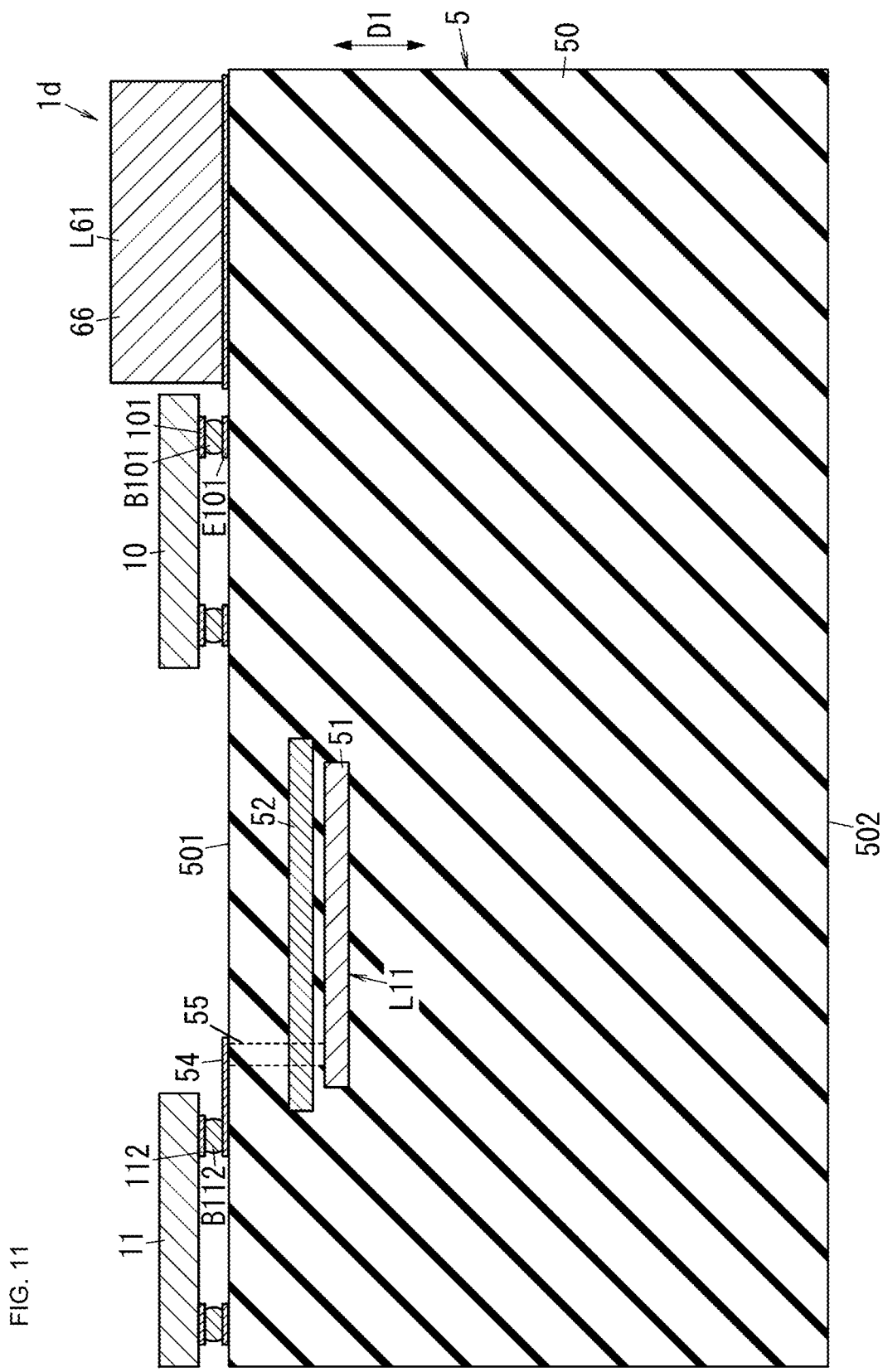
FIG. 11 is a sectional view of the radio-frequency module according to Embodiment 5.

The following describes a radio-frequency module 1d according to Embodiment 5 with reference to FIGS. 10 and 11. Constituent elements of the radio-frequency module 1d according to Embodiment 5 that are similar to the corresponding constituent elements of the radio-frequency module 1b according to Embodiment 3 are denoted by the same reference signs, and a redundant description thereof will be omitted where appropriate. A communication device 400d includes the radio-frequency module 1d according to Embodiment 5. Constituent elements of the communication device 400d that are similar to the corresponding constituent elements of the communication device 400 including the radio-frequency module 1 according to Embodiment 1 are denoted by the same reference signs, and a redundant description thereof will be omitted where appropriate.

As illustrated in FIG. 10, the radio-frequency module 1d according to Embodiment 5 includes the power amplifier 11, the first matching circuit 14, a low-noise amplifier 10, and a second matching circuit 18.

The power amplifier 11 includes the input terminal 111 and the output terminal 112 (hereinafter also referred to as "output pad electrode 112"). The power amplifier 11 amplifies the transmission signals in the first frequency band and outputs the resultant signals from the output pad electrode 112.

The first matching circuit 14 is connected to the output pad electrode 112 of the power amplifier 11. The first matching circuit 14 is thus regarded as an output matching circuit. The first matching circuit 14 is the impedance matching circuit for matching the output impedance of a circuit antecedent to the first matching circuit 14 to the input impedance of a circuit subsequent to the first matching circuit 14. More specifically, with the first matching circuit 14 being viewed from the power amplifier 11, the first matching circuit 14 adjusts the impedance on the antenna terminal T10 side (the output impedance of the power amplifier 11) in the fundamental frequency of the first transmission signals to, for example, 50Ω.

The low-noise amplifier 10 includes an input terminal 101 (hereinafter also referred to as "input pad electrode 101") and an output terminal 102. The low-noise amplifier 10 amplifies the reception signals in the second frequency band higher than the first frequency band and outputs the resultant signals.

The second matching circuit 18 is connected to the input pad electrode 101 of the low-noise amplifier 10. The second matching circuit 18 is thus regarded as an input matching circuit. The second matching circuit 18 is disposed between the input pad electrode 101 of the low-noise amplifier 10 and the antenna terminal T10. The second matching circuit 18 is the impedance matching circuit for matching the output impedance of a circuit antecedent to the second matching circuit 18 to the input impedance of a circuit subsequent to the second matching circuit 18. More specifically, with the second matching circuit 18 being viewed from the low-noise amplifier 10, the second matching circuit 18 adjusts the impedance on the antenna terminal T10 side (the input impedance of the low-noise amplifier 10) in the fundamental frequency of reception signals to, for example, 50Ω.

The radio-frequency module 1d according to Embodiment 5 also includes an antenna switch 7. The antenna switch 7 includes a common terminal 70 and a plurality of selection terminals (e.g., two selection terminals (71 and 72) as illustrated in FIG. 10).

The antenna switch 7 is disposed between the antenna terminal T10 and each of the first matching circuit 14 and the second matching circuit 18. The selection terminal 71 of the antenna switch 7 is connected to the first matching circuit 14, and the selection terminal 72 of the antenna switch 7 is connected to the second matching circuit 18. The antenna switch 7 is, for example, a switching IC.

The power amplifier 11, the low-noise amplifier 10, and the antenna switch 7 in the radio-frequency module 1d are controlled by, for example, a signal processing circuit 401d. In some embodiments, the radio-frequency module 1d may include a control circuit that controls the power amplifier 11, the low-noise amplifier 10, and the antenna switch 7 in accordance with control signals from outside the radio-frequency module 1d (e.g., control signals from the signal processing circuit 401d). The control circuit is, for example, an IC.

The radio-frequency module 1d performs simultaneous communication by using the power amplifier 11 and the low-noise amplifier 10. The radio-frequency module 1d can, for example, transmit transmission signals in Band 8 and receive reception signals in Band 3 at the same time. The simultaneous communication may involve carrier aggregation or dual connectivity.

The first matching circuit 14 in the radio-frequency module 1d is identical to the first matching circuit 14 in the radio-frequency module 1 according to Embodiment 1 and includes a plurality of first inductor portions (e.g., six first inductor portions (L11 to L16) as illustrated in FIG. 2). The first matching circuit 14 also includes a plurality of capacitors (e.g., four capacitors (C11 to C14) as illustrated in FIG. 2). The first matching circuit 14 also serves as a first filter. The first filter allows transmission signals in the first frequency band to pass therethrough and attenuates signals in frequency bands other than the first frequency band.

The second matching circuit 18 includes at least one second inductor portion (e.g., a second inductor portion L61) connected to the input pad electrode 101 of the low-noise amplifier 10 (see FIG. 11). The second inductor portion L61 in the second matching circuit 18 is located on a signal path LT4 connected to the input pad electrode 101 and is closer than the other second inductor portions on the signal path LT4 to the input pad electrode 101. The expression "closer than the other second inductor portions to the input pad electrode 101" herein means being circuit-wise closer than the other second inductor portions to input pad electrode 101. The second matching circuit 18 also serves as a second filter. The second filter allows transmission signals in the second frequency band to pass therethrough and attenuates signals in frequency bands other than the second frequency band.

As illustrated in FIG. 11, the radio-frequency module 1d according to Embodiment 5 includes the multilayer substrate 5. The multilayer substrate 5 has the first main surface 501 and the second main surface 502 located opposite to each other and is provided with the power amplifier 11, the first matching circuit 14, the low-noise amplifier 10, and the second matching circuit 18.

The first inductor portion L11 includes the inner-layer inductor portion 51, which is located in (provided as an inner layer of) the multilayer substrate 5. The inner-layer inductor portion 51 is located away from the first main surface 501 and the second main surface 502 of the multilayer substrate 5. The first inductor portion L11 is circuit-wise closer than the other first inductor portions (L12 to L16) to the output pad electrode 112 of the power amplifier 11.

As with the multilayer substrate 5 in the radio-frequency module 1b according to Embodiment 3, the multilayer substrate 5 in the radio-frequency module 1d according to Embodiment 5 includes the ground layer 52 (see FIG. 11). The ground layer 52 is located between the first main surface 501 and the second main surface 502 and is located away from the first main surface 501 and the second main surface 502. The ground layer 52 at least partially overlaps the inner-layer inductor portion 51 when viewed in a plan view in the thickness direction D1 of the multilayer substrate 5. The ground layer 52 overlaps the inner-layer inductor portion 51 substantially along the entire length of the inner-layer inductor portion 51 when viewed in a plan view in the thickness direction D1 of the multilayer substrate 5.

The ground layer 52 extends beyond the inner-layer inductor portion 51 when viewed in a plan view in the thickness direction D1 of the multilayer substrate 5. The inner-layer inductor portion 51 is located on the inner side with respect to the periphery of the ground layer 52 when viewed in a plan view in the thickness direction D1 of the multilayer substrate 5.

The ground layer 52 between the first main surface 501 and the second main surface 502 is located closer than the inner-layer inductor portion 51 to the first main surface 501, on which low-noise amplifier 10 is mounted. In the thickness direction D1 of the multilayer substrate 5, the distance between the first main surface 501 and the surface of the ground layer 52 facing the inner-layer inductor portion 51 is thus shorter than the shortest distance between the first main surface 501 and the inner-layer inductor portion 51.

The ground layer 52 may be a conductor portion that is at ground potential during, for example, periods of use of the radio-frequency module 1d.

The ground layer 52 has the holes 521 (see FIG. 5B), which are through-holes extending in the thickness direction D1 of the multilayer substrate 5.

The ground layer 52 is located between the inner-layer inductor portion 51 and the second inductor portion L61 in the second matching circuit 18.

The distance between the ground layer 52 and the inner-layer inductor portion 51 in the radio-frequency module 1d is shorter than the distance between the ground layer 52 and the second inductor portion L61 in the second matching circuit 18.

As illustrated in FIG. 10, the communication device 400d includes the radio-frequency module 1d and the signal processing circuit 401d. The signal processing circuit 401d processes transmission signals and reception signals. The signal processing circuit 401d includes an RF signal processing circuit 402d and a baseband signal processing circuit 403d.

The RF signal processing circuit 402d is connected to the radio-frequency module 1d. More specifically, the RF signal processing circuit 402d is connected to the input terminal 111 of the power amplifier 11 in the radio-frequency module 1d and to the output terminal 102 of the low-noise amplifier 10 in the radio-frequency module 1d.

The RF signal processing circuit 402d is, for example, a radio-frequency integrated circuit (RFIC). The RF signal processing circuit 402d processes radio-frequency signals (reception signals) outputted from the output terminal 102 of the low-noise amplifier 10. The RF signal processing circuit 402d performs signal processing such as down-conversion on radio-frequency signals (reception signals) inputted from the antenna 200 through the radio-frequency module 1d and outputs the resultant reception signals to the baseband signal processing circuit 403d.

The baseband signal processing circuit 403d is, for example, a baseband integrated circuit (BBIC). The reception signals processed by the baseband signal processing circuit 403d are used, for example, as image signals for displaying an image or as audio signals for a telephone conversation.

The RF signal processing circuit 402d also performs signal processing such as up-conversion on transmission signals outputted by the baseband signal processing circuit 403d and outputs the resultant transmission signals (radio-frequency signals) to the radio-frequency module 1d. The baseband signal processing circuit 403d performs certain signal processing on transmission signals received from outside the communication device 400d. The resultant transmission signals are inputted to the input terminal 111 of the power amplifier 11.

The radio-frequency module 1d according to Embodiment 5 is capable of suppressing (magnetic) the coupling between the first inductor portion L11 in the first matching circuit 14 and the second inductor portion L61 in the second matching circuit 18. More specifically, the radio-frequency module 1d according to Embodiment 5 is capable of eliminating or reducing the possibility that unwanted radiation on the output side of the power amplifier 11, which is provided for the low band specified by the 4G or 5G standard, will hop onto the input side of the low-noise amplifier 10, which is provided for the midband specified by the 2G standard. The radio-frequency module 1d according to Embodiment 5 is thus capable of eliminating or reducing the possibility that the reception performance of the receiving circuit including the low-noise amplifier 10 will degrade.

In the radio-frequency module 1d according to Embodiment 5, the at least one inductor portion (the second inductor portion L61) includes a chip inductor 66, which is mounted on the first main surface 501 or the second main surface 502 of the multilayer substrate 5 (e.g., on the first main surface 501 as illustrated in FIG. 11). The multilayer substrate 5 includes the ground layer 52 located between the inner-layer inductor portion 51 and the chip inductor 66 in the thickness direction D1 of the multilayer substrate 5. The ground layer 52 at least partially overlaps the inner-layer inductor portion 51 when viewed in a plan view in the thickness direction D1. The radio-frequency module 1d according to Embodiment 5 is thus more capable of eliminating or reducing the possibility that unwanted radiation (the harmonic wave of transmission signals) from the inner-layer inductor portion 51 will hop onto the second inductor portion L61 in the second matching circuit 18.

Embodiment 6

Figure 12:
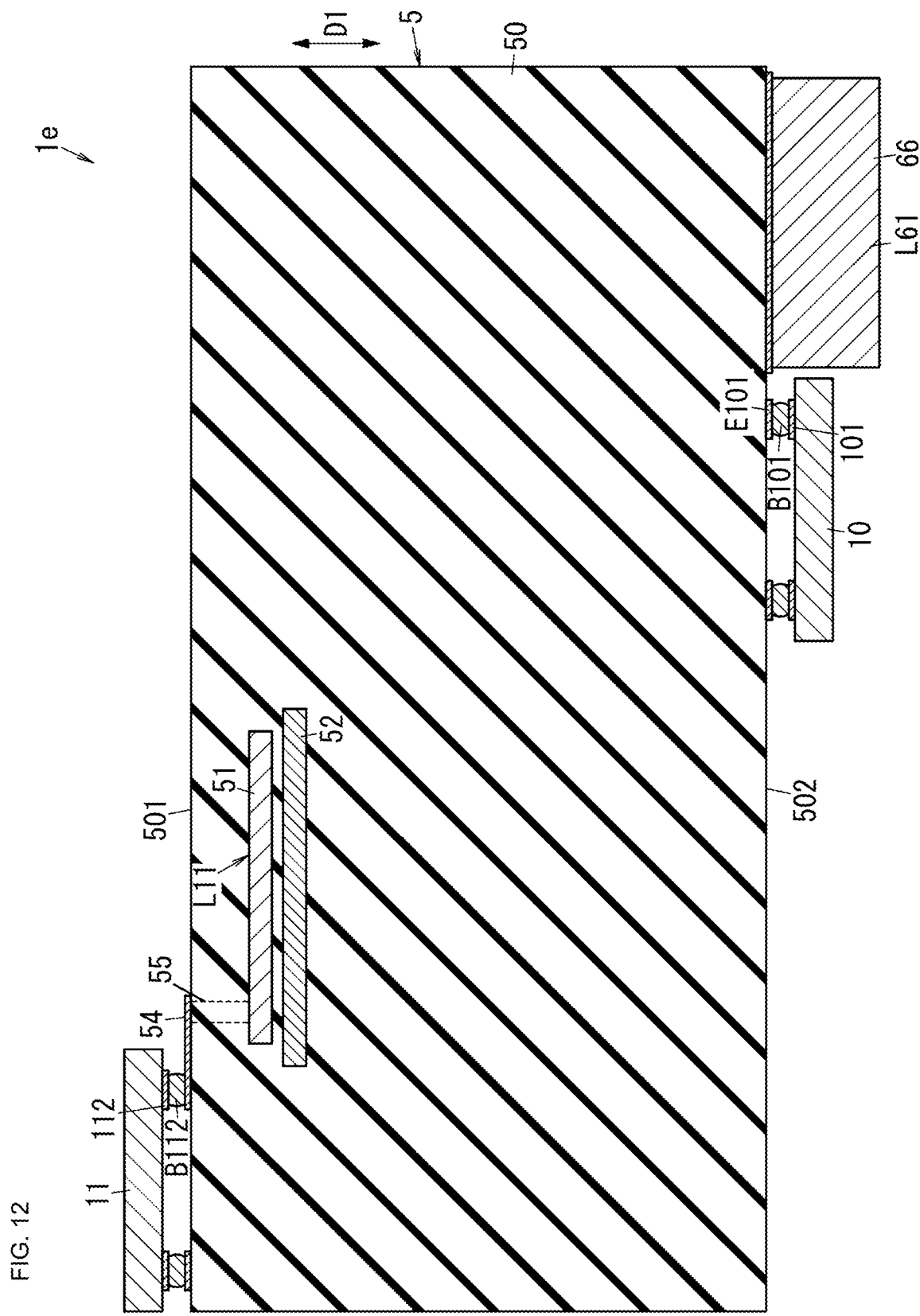
FIG. 12 is a sectional view of a radio-frequency module according to Embodiment 6.

The following describes a radio-frequency module 1e according to Embodiment 6 with reference to FIG. 12.

Constituent elements of the radio-frequency module 1e according to Embodiment 6 that are similar to the corresponding constituent elements of the radio-frequency module 1d according to Embodiment 5 are denoted by the same reference signs, and a redundant description thereof will be omitted.

The radio-frequency module 1e according to Embodiment 6 differs from the radio-frequency module 1d according to Embodiment 5 in that the low-noise amplifier 10 is mounted on the second main surface 502 of the multilayer substrate 5. In the radio-frequency module 1e according to Embodiment 6, the power amplifier 11 is mounted on the first main surface 501 of the multilayer substrate 5, whereas the low-noise amplifier 10 is mounted on the second main surface 502 of the multilayer substrate 5.

The ground layer 52 between the first main surface 501 and the second main surface 502 is located closer than the inner-layer inductor portion 51 to the second main surface 502, on which low-noise amplifier 10 is mounted. In the thickness direction D1 of the multilayer substrate 5, the distance between the second main surface 502 and the surface of the ground layer 52 facing the inner-layer inductor portion 51 is thus shorter than the shortest distance between the second main surface 502 and the inner-layer inductor portion 51.

As with the radio-frequency module 1d according to Embodiment 5, the radio-frequency module 1e according to Embodiment 6 is capable of suppressing (magnetic) the coupling between the first inductor portion L11 in the first matching circuit 14 and the second inductor portion L61 in the second matching circuit 18. More specifically, the radio-frequency module 1e according to Embodiment 6 is capable of eliminating or reducing the possibility that unwanted radiation on the output side of the power amplifier 11, which is provided for the low band specified by the 4G or 5G standard, will hop onto the input side of the low-noise amplifier 10, which is provided for the midband specified by the 2G standard. The communication device 400d according to Embodiment 5 may include the radio-frequency module 1e in place of the radio-frequency module 1d.

Embodiment 1 to 6, which have been described so far, are merely example embodiments of the present disclosure. Various alterations may be made to Embodiments 1 to 6 in accordance with, for example, designs in such a manner that the objective of the present disclosure is achieved.

In the radio-frequency module 1 according to Embodiment 1, the output pad electrode 112 of the first power amplifier 11 is connected to the conductor portion 54 via the bonding wire W1. In some embodiments, the output pad electrode 112 may be connected to the conductor portion 54 via a plurality of bonding wires W1. This feature, in which the output pad electrode 112 of the first power amplifier 11 is connected to the conductor portion 54 via the bonding wire(s) W1, is applicable to the radio-frequency modules 1c, 1d, and 1e. In the radio-frequency module 1a according to Embodiment 2, the output pad electrode 122 of the second power amplifier 12 is connected to the conductor portion 60 via the bonding wire W2. In some embodiments, the output pad electrode 122 may be connected to the conductor portion 60 via a plurality of bonding wires W2.

Of the first inductor portions (L11 to L16) in the first matching circuit 14 in the radio-frequency module 1 according to Embodiment 1, the first inductor portion L11 is to include the inner-layer inductor portion 51. The configuration and layout of the first inductor portions L12 to L16 are not limited.

The first matching circuit 14 and the second matching circuit 15 serve as filters (transmitting filters). In some embodiments, the first transmitting circuit 110 may include a transmitting filter independent of the first matching circuit 14, and the second transmitting circuit 120 may include a transmitting filter independent of the second matching circuit 15.

The radio-frequency module 1 according to Embodiment 1 may include, in place of the duplexers 81 to 83, transmitting filters and receiving filters as individual components. It is not always required that the duplexers 81 to 83 be mounted on the multilayer substrate 5. Alternatively, the radio-frequency module 1 according to according to Embodiment 1 may include multiplexers in place of the duplexers 81 to 83.

The radio-frequency module 1 according to Embodiment 1 may include all or part of the configuration of the second radio-frequency module 2. The radio-frequency module 1 according to Embodiment 1 may include the diplexer 300 in addition to all or part of the configuration of the second radio-frequency module 2.

It is required that the communication device 400 including the radio-frequency module 1 according to Embodiment 1 be capable of supporting at least two downlinks. For example, the communication device 400 may be capable of supporting three downlinks. In this case, it is only required that the diplexer 300 be replaced with a triplexer.

Figure 13:
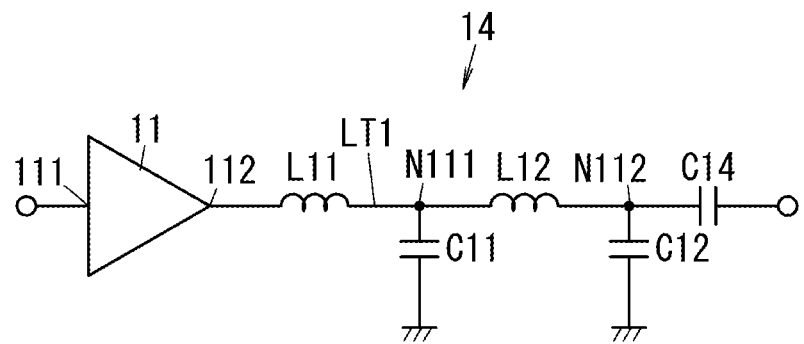
FIG. 13 is a circuit diagram of a first matching circuit according to another embodiment.
Figure 14:
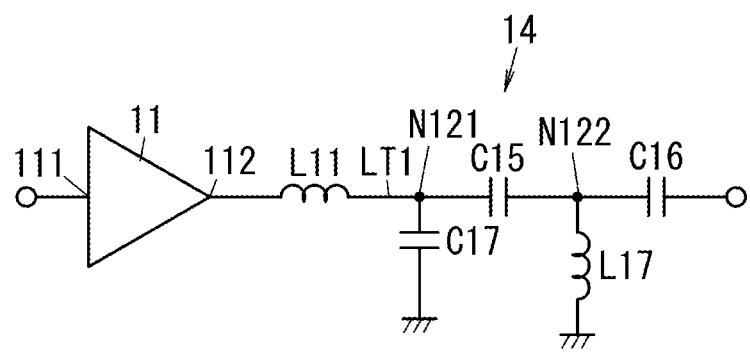
FIG. 14 is a circuit diagram of a first matching circuit according to still another embodiment.
Figure 15:
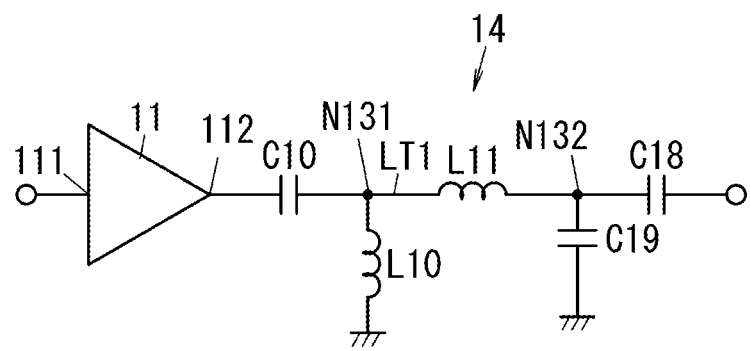
FIG. 15 is a circuit diagram of a first matching circuit according to yet still another embodiment.

The circuit configuration of the first matching circuit 14 is not limited to the circuit configuration illustrated in FIG. 2 and may be the circuit configuration illustrated in any one of FIGS. 13 to 15 or another circuit configuration.

The first matching circuit 14 illustrated in FIG. 13 includes two first inductor portions (L11 and L12) and three capacitors (C11, C12, and C14). One end of the first inductor portion L11 in the first matching circuit 14 is connected to the output terminal 112 of the power amplifier 11, and the other end of the first inductor portion L11 is connected to a series circuit including the first inductor portion L12 and the capacitor C14. The first inductor portion L11, the first inductor portion L12, and the capacitor C14 in the first matching circuit 14 are located on the signal path LT1, which is connected to the output terminal 112 (the output pad electrode 112) of the power amplifier 11. That is, the first matching circuit 14 includes the first inductor portions L11 and L12, which are series inductor portions on the signal path LT1. The capacitor C11 in the first matching circuit 14 is connected between the ground and a node N111, which is located between the first inductor portions L11 and L12 on the signal path LT1. The capacitor C12 in the first matching circuit 14 is connected between the ground and a node N112, which is located between the first inductor portion L12 and the capacitor C14 on the signal path LT1.

The first matching circuit 14 illustrated in FIG. 14 includes two first inductor portions (L11 and L17) and three capacitors (C15 to C17). One end of the first inductor portion L11 in the first matching circuit 14 is connected to the output terminal 112 of the power amplifier 11, and the other end of the first inductor portion L11 is connected to a series circuit including the capacitors C15 and C16. The first inductor portion L11, the capacitor C15, and the capacitor C16 in the first matching circuit 14 are located on the signal path LT1, which is connected to the output terminal 112 (the output pad electrode 112) of the power amplifier 11. That is, the first matching circuit 14 includes the first inductor portion L11, which is a series inductor portion on the signal path LT1. The capacitor C17 in the first matching circuit 14 is connected between the ground and a node N121, which is located between the first inductor portion L11 and the capacitor C15 on the signal path LT1. The first inductor portion L17 in the first matching circuit 14 is connected between the ground and a node N122, which is located between the capacitors C15 and C16 on the signal path LT1.

The first matching circuit 14 illustrated in FIG. 15 includes two first inductor portions (L10 and L11) and three capacitors (C10, C18, and C19). One end of the first inductor portion L11 in the first matching circuit 14 is connected to the output terminal 112 of the power amplifier 11 via the capacitor C10, and the other end of the first inductor portion L11 is connected to the capacitor C18. The capacitor C10, the first inductor portion L11, and the capacitor C18 in the first matching circuit 14 are located on the signal path LT1, which is connected to the output terminal 112 (the output pad electrode 112) of the power amplifier 11. That is, the first matching circuit 14 includes the first inductor portion L11, which is a series inductor portion on the signal path LT1. The first inductor portion L10 in the first matching circuit 14 is connected between the ground and a node N131, which is located between the capacitor C10 and the first inductor portion L11 on the signal path LT1. The first inductor portion L10 is a parallel inductor portion located between the signal path LT1 and the ground. The capacitor C19 in the first matching circuit 14 is connected between the ground and a node N132, which is located between the first inductor portion L11 and the capacitor C18 on the signal path LT1.

Referring to FIG. 15, the first inductor portion that is circuit-wise closer than the other first inductor portions to the output pad electrode 112 of the power amplifier 11 is at least one of a series inductor portion (the first inductor portion L11) included in the first matching circuit 14 and located on the signal path LT1 connected to the output pad electrode 112 and a parallel inductor portion (the first inductor portion L10) included in the first matching circuit 14 and located between the signal path LT1 and the ground.

Aspect of Disclosure

The following aspects of the present disclosure are disclosed herein.

According to a first aspect, a radio-frequency module (1, 1a, 1b, 1c) includes a first power amplifier (11), a first matching circuit (14), a second power amplifier (12), a second matching circuit (15), and a multilayer substrate (5). The first power amplifier (11) includes an output pad electrode (112) and is configured to amplify first transmission signals in a first frequency band and to output resultant signals from the output pad electrode (112). The first matching circuit (14) includes a plurality of first inductor portions (L11 to L16) and is connected to the output pad electrode (112) of the first power amplifier (11). The second power amplifier (12) is configured to amplify second transmission signals in a second frequency band higher than the first frequency band and to output resultant signals. The second matching circuit (15) includes at least one second inductor portion (L21) and is connected to an output side of the second power amplifier (12). The multilayer substrate (5) has a first main surface (501) and a second main surface (502) located opposite to each other and is provided with the first power amplifier (11), the first matching circuit (14), the second power amplifier (12), and the second matching circuit (15). The first inductor portion (L11) closer than the other first inductor portions (L12 to L16) to the output pad electrode (112) includes an inner-layer inductor portion (51) located in the multilayer substrate (5).

The radio-frequency module (1, 1a, 1b, 1c) according to the first aspect is capable of suppressing the coupling between the first inductor portion in the first matching circuit and the second inductor portion in the second matching circuit.

According to a second aspect, the at least one second inductor portion (L21) in the radio-frequency module (1, 1a, 1b, 1c) in the first aspect includes a chip inductor (65) mounted on the first main surface (501) or the second main surface (502) of the multilayer substrate (5). The multilayer substrate (5) includes a ground layer (52) located between the inner-layer inductor portion (51) and the chip inductor (65) in a thickness direction (D1) of the multilayer substrate (5). The ground layer (52) at least partially overlaps the inner-layer inductor portion (51) when viewed in a plan view in the thickness direction (D1).

The radio-frequency module (1, 1a, 1b, 1c) according to the second aspect is capable of eliminating or reducing the possibility that unwanted radiation (the harmonic wave of the first transmission signals) from the inner-layer inductor portion (51) will hop onto the at least one second inductor portion (L21) in the second matching circuit (15).

According to a third aspect, the at least one second inductor portion (L21) in the radio-frequency module (1, 1a, 1b, 1c) in the first aspect includes a second inner-layer inductor portion located in the multilayer substrate (5) and discretely located away from a first inner-layer inductor portion that is the inner-layer inductor portion (51) included in the first matching circuit (14). The first inner-layer inductor portion (the inner-layer inductor portion 51) and the second inner-layer inductor portion (53) are in different positions in the thickness direction (D1) of the multilayer substrate (5). The multilayer substrate (5) includes the ground layer (52) located between the first inner-layer inductor portion (the inner-layer inductor portion 51) and the second inner-layer inductor portion (53) in the thickness direction (D1). The ground layer (52) at least partially overlaps the first inner-layer inductor portion (the inner-layer inductor portion 51) when viewed in a plan view in the thickness direction (D1).

The radio-frequency module (1, 1a, 1b, 1c) according to the third aspect is capable of eliminating or reducing the possibility that unwanted radiation (the harmonic wave of the first transmission signals) from the first inner-layer inductor portion (the inner-layer inductor portion 51) in the first matching circuit (14) will hop onto the second inner-layer inductor portion (53) included in the at least one second inductor portion (L21) in the second matching circuit (15).

According to a fourth aspect, the first inductor portion (L11) closer than the other first inductor portions to the output pad electrode (112) in the radio-frequency module (1, 1a, 1b, 1c) in the second or third aspect is at least one of a series inductor portion included in the first matching circuit (14) and located on a signal path (LT1) connected to the output pad electrode (112) and a parallel inductor portion included in the first matching circuit (14) and located between the signal path (LT1) and the ground.

According to a fifth aspect, the second power amplifier (12) in the radio-frequency module (1, 1a, 1b, 1c) in any one of the second to fourth aspects is mounted on the first main surface (501) or the second main surface (502) of the multilayer substrate (5). The ground layer (52) between the first main surface (501) and the second main surface (502) is located closer than the inner-layer inductor portion (51) to one of the main surfaces on which the second power amplifier (12) is mounted.

The radio-frequency module (1, 1a, 1b, 1c) according to the fifth aspect is more capable of eliminating or reducing the possibility that unwanted radiation (the harmonic wave of the first transmission signals) from the inner-layer inductor portion (51) will hop onto the at least one second inductor portion (L21) in the second matching circuit (15).

According to a sixth aspect, the second power amplifier (12) in the radio-frequency module (1, 1a, 1b, 1c) in any one of the second to fifth aspects includes the output pad electrode (122). The second inductor portion (L21) is one of a plurality of second inductor portions (L21 to L26). The ground layer (52) is located between the inner-layer inductor portion (51) and the second inductor portion (L21) being located on a signal path (LT2) connected to the output pad electrode (122) of the second power amplifier (12) and being closer than the other second inductor portions (L22 to L26) on the signal path (LT2) to the output pad electrode (122) of the second power amplifier (12).

The radio-frequency module (1, 1a, 1b, 1c) according to the sixth aspect is capable of eliminating or reducing the possibility that unwanted radiation (the harmonic wave of the first transmission signals) from the inner-layer inductor portion (51) will hop onto the second inductor portion (L21) closer than the other second inductor portions to the output pad electrode (122) of the second power amplifier (12).

According to a seventh aspect, the distance between the ground layer (52) and the inner-layer inductor portion (51) in the radio-frequency module (1, 1a, 1b, 1c) in the sixth aspect is shorter than the distance between the ground layer (52) and the second inductor portion (L21) closer than the other second inductor portions (L22 to L26) to the output pad electrode (122) of the second power amplifier (12).

The radio-frequency module (1, 1a, 1b, 1c) according to the seventh aspect is more capable of eliminating or reducing the possibility that unwanted radiation (the harmonic wave of the first transmission signals) from the first inner-layer inductor portion (the inner-layer inductor portion 51) will hop onto the second inductor portion (L21) closer than the other second inductor portions to the output pad electrode (122) of the second power amplifier (12).

According to an eighth aspect, the radio-frequency module (1, 1a, 1b, 1c) in any one of the first to seventh aspects further includes a bypass terminal (T15). The bypass terminal (T15) is connected to the second power amplifier (12) via the second matching circuit (15) to output, to an outside of the radio-frequency module (1, 1a, 1b, 1c), the second transmission signals from the second power amplifier (12).

The radio-frequency module (1, 1a, 1b, 1c) according to the eight aspect is capable of eliminating or reducing the possibility that the reception performance of, for example, a receiving circuit connected to the bypass terminal (T15) will degrade.

According to a ninth aspect, the radio-frequency module (1, 1a, 1b, 1c) in any one of the first to eighth aspects performs simultaneous communication by using the first power amplifier (11) and the second power amplifier (12).

According to a tenth aspect, a communication device (400) includes the radio-frequency module (1, 1a, 1b, 1c) in any one of the first to ninth aspects and a signal processing circuit (401) configured to process the first transmission signals and the second transmission signals.

The communication device (400) according to the tenth aspect is capable of suppressing the coupling between the first inductor portion (L11) in the first matching circuit (14) and the second inductor portion (L21) in the second matching circuit (15).

According to an eleventh aspect, a radio-frequency module (1d, 1e) includes a power amplifier (11), a first matching circuit (14), a low-noise amplifier (10), a second matching circuit (18), and a multilayer substrate (5). The power amplifier (11) includes an output pad electrode (112) and is configured to amplify transmission signals in a first frequency band and to output resultant signals from the output pad electrode (112). The first matching circuit (14) includes a plurality of first inductor portions (L11 to L16) and is connected to the output pad electrode (112) of the power amplifier (11). The low-noise amplifier (10) is configured to amplify reception signals in a second frequency band higher than the first frequency band and to output resultant signals. The second matching circuit (18) includes at least one second inductor portion (L61) and is connected to an input pad electrode (101) of the low-noise amplifier (10). The multilayer substrate (5) has a first main surface (501) and a second main surface (502) located opposite to each other and is provided with the power amplifier (11), the first matching circuit (14), the low-noise amplifier (10), and the second matching circuit (18). The first inductor portion (L11) closer than the other first inductor portions (L12 to L16) to the output pad electrode (112) includes an inner-layer inductor portion (51) located in the multilayer substrate (5).

The radio-frequency module (1d, 1e) according to the eleventh aspect is capable of suppressing the coupling between the first inductor portion (L11) in the first matching circuit (14) and the second inductor portion (L21) in the second matching circuit (15).

According to a twelfth aspect, the at least one second inductor portion (L61) in the radio-frequency module (1d, 1e) according to the eleventh aspect includes a chip inductor (66) mounted on the first main surface (501) or the second main surface (502) of the multilayer substrate (5). The multilayer substrate (5) includes a ground layer (52) located between the inner-layer inductor portion (51) and the chip inductor (66) in a thickness direction (D1) of the multilayer substrate (5). The ground layer (52) at least partially overlaps the inner-layer inductor portion (51) when viewed in plan in the thickness direction (D1).

The radio-frequency module (1d, 1e) according to the twelfth aspect is capable of eliminating or reducing the possibility that unwanted radiation (the harmonic wave of transmission signals) from the inner-layer inductor portion (51) will hop onto the at least one second inductor portion (L61) in the second matching circuit (18).

According to thirteenth aspect, the first inductor portion (L11) closer than the other first inductor portions to the output pad electrode (112) in the radio-frequency module (1d, 1e) according to the twelfth aspect is at least one of a series inductor portion included in the first matching circuit (14) and located on a signal path (LT1) connected to the output pad electrode (112) and a parallel inductor portion included in the first matching circuit (14) and located between the signal path (LT1) and the ground.

According to a fourteenth aspect, the low-noise amplifier (10) in the radio-frequency module (1d, 1e) in the twelfth or thirteenth aspect is mounted on the first main surface (501) or the second main surface (502) of the multilayer substrate (5). The ground layer (52) between the first main surface (501) and the second main surface (502) is located closer than the inner-layer inductor portion (51) to one of the main surfaces on which the low-noise amplifier (10) is mounted.

The radio-frequency module (1d, 1e) according to the fourteenth aspect is more capable of eliminating or reducing the possibility that unwanted radiation (the harmonic wave of transmission signals) from the inner-layer inductor portion (51) will hop onto the at least one second inductor portion (L61) in the second matching circuit (18).

According to a fifteenth aspect, the second inductor portion (L61) in the radio-frequency module (1d, 1e) according to any one of the twelfth to fourteenth aspect is one of a plurality of second inductor portions. The ground layer (52) is located between the inner-layer inductor portion (51) and the second inductor portion (L61) being located on a signal path (LT4) connected to the input pad electrode (101) and being closer than the other second inductor portions on the signal path (LT4) in the second matching circuit (18) to the input pad electrode (101).

The radio-frequency module (1d, 1e) according to the fifteenth aspect is capable of eliminating or reducing the possibility that the harmonic wave of the transmission signals in the first frequency band will hop onto the second inductor portion (L61) being located on the signal path (LT4) connected to the input pad electrode (101) of the low-noise amplifier (10) and being closer than the other second inductor portions on the signal path (LT4) to the input pad electrode (101).

According to a sixteenth aspect, the distance between the ground layer (52) and the inner-layer inductor portion (51) in the radio-frequency module (1d, 1e) in the fifteenth aspect is shorter than the distance between the ground layer (52) and the second inductor portion (L61) closer than the other second inductor portions in the second matching circuit (18) to the input pad electrode (101).

The radio-frequency module (1d, 1e) according to the sixteenth aspect is more capable of eliminating or reducing the possibility that unwanted radiation (the harmonic wave of transmission signals) from the inner-layer inductor portion (51) will hop onto the second inductor portion (L61) closer than the other second inductor portions to the output pad electrode (101) of the low-noise amplifier (10).

According to a seventeenth aspect, the radio-frequency module (1d, 1e) in any one of the eleventh to sixteenth aspects performs simultaneous communication by using the power amplifier (11) and the low-noise amplifier (10).

According to an eighteenth aspect, a communication device (400d) includes the radio-frequency module (1d, 1e) according to any one of the eleventh to seventeenth aspects and a signal processing circuit (401d) configured to processes the transmission signals and the reception signals.

The communication device (400d) according to the eighteenth aspect is capable of suppressing the coupling between the first inductor portion (L11) in the first matching circuit (14) and the second inductor portion (L61) in the second matching circuit (18).

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
a first power amplifier including an output pad electrode and configured to amplify first transmission signals in a first frequency band and to output resultant first transmission signals from the output pad electrode;
a first matching circuit including a plurality of first inductor portions and connected to the output pad electrode of the first power amplifier;
a second power amplifier configured to amplify second transmission signals in a second frequency band higher than the first frequency band and to output resultant second transmission signals;
a second matching circuit including at least one second inductor portion and connected to an output side of the second power amplifier; and
a multilayer substrate having a first main surface and a second main surface located opposite to each other and provided with the first power amplifier, the first matching circuit, the second power amplifier, and the second matching circuit,
wherein one of the first inductor portions closer than the other first inductor portions to the output pad electrode includes an inner-layer inductor portion located in the multilayer substrate.

2. The radio-frequency module according to claim 1, wherein
the at least one second inductor portion includes a chip inductor mounted on the first main surface or the second main surface of the multilayer substrate, and
the multilayer substrate includes a ground layer located between the inner-layer inductor portion and the chip inductor in a thickness direction of the multilayer substrate, the ground layer at least partially overlapping the inner-layer inductor portion when viewed in a plan view in the thickness direction.

3. The radio-frequency module according to claim 1, wherein
the at least one second inductor portion includes a second inner-layer inductor portion located in the multilayer substrate and discretely located away from a first inner-layer inductor portion being the inner-layer inductor portion included in the first matching circuit,
the first inner-layer inductor portion and the second inner-layer inductor portion are in different positions in a thickness direction of the multilayer substrate, and
the multilayer substrate includes a ground layer located between the first inner-layer inductor portion and the second inner-layer inductor portion in the thickness direction, the ground layer at least partially overlapping the first inner-layer inductor portion when viewed in a plan view in the thickness direction.

4. The radio-frequency module according to claim 2, wherein one of the first inductor portions closer than the other first inductor portions to the output pad electrode is at least one of a series inductor portion included in the first matching circuit and located on a signal path connected to the output pad electrode and a parallel inductor portion included in the first matching circuit and located between the signal path and a ground.

5. The radio-frequency module according to claim 2, wherein
the second power amplifier is mounted on the first main surface or the second main surface of the multilayer substrate, and
the ground layer between the first main surface and the second main surface is located closer than the inner-layer inductor portion to one of the first and second main surfaces on which the second power amplifier is mounted.

6. The radio-frequency module according to claim 2, wherein
the second power amplifier includes an output pad electrode,
the at least one second inductor portion comprises a plurality of second inductor portions, and
the ground layer is located between the inner-layer inductor portion and one of the second inductor portions being located on a signal path connected to the output pad electrode of the second power amplifier and being closer than the other second inductor portions on the signal path to the output pad electrode of the second power amplifier.

7. The radio-frequency module according to claim 6, wherein a distance between the ground layer and the inner-layer inductor portion is shorter than a distance between the ground layer and one of the second inductor portions closer than the other second inductor portions to the output pad electrode of the second power amplifier.

8. The radio-frequency module according to claim 1, further comprising a bypass terminal connected to the second power amplifier via the second matching circuit to output, to an outside of the radio-frequency module, transmission signals from the second power amplifier.

9. The radio-frequency module according to claim 1, configured to perform simultaneous communication by using the first power amplifier and the second power amplifier.

10. A communication device comprising:
the radio-frequency module according to claim 1; and
a signal processing circuit configured to process the first transmission signals and the second transmission signals.

11. A radio-frequency module comprising:
a power amplifier including an output pad electrode and configured to amplify transmission signals in a first frequency band and to output resultant transmission signals from the output pad electrode;
a first matching circuit including a plurality of first inductor portions and connected to the output pad electrode of the power amplifier;
a low-noise amplifier including an input pad electrode and configured to amplify reception signals in a second frequency band higher than the first frequency band and to output resultant reception signals;
a second matching circuit including at least one second inductor portion and connected to the input pad electrode of the low-noise amplifier; and
a multilayer substrate having a first main surface and a second main surface located opposite to each other and provided with the power amplifier, the first matching circuit, the low-noise amplifier, and the second matching circuit,
wherein one of the first inductor portions closer than the other first inductor portions to the output pad electrode includes an inner-layer inductor portion located in the multilayer substrate.

12. The radio-frequency module according to claim 11, wherein
 the at least one second inductor portion includes a chip inductor mounted on the first main surface or the second main surface of the multilayer substrate, and
 the multilayer substrate includes a ground layer located between the inner-layer inductor portion and the chip inductor in a thickness direction of the multilayer substrate, the ground layer at least partially overlapping the inner-layer inductor portion when viewed in a plan view in the thickness direction.

13. The radio-frequency module according to claim 12, wherein one of the first inductor portions closer than the other first inductor portions to the output pad electrode is at least one of a series inductor portion included in the first matching circuit and located on a signal path connected to the output pad electrode and a parallel inductor portion included in the first matching circuit and located between the signal path and a ground.

14. The radio-frequency module according to claim 12, wherein
 the low-noise amplifier is mounted on the first main surface or the second main surface of the multilayer substrate, and
 the ground layer between the first main surface and the second main surface is located closer than the inner-layer inductor portion to one of the first and second main surfaces on which the low-noise amplifier is mounted.

15. The radio-frequency module according to claim 12, wherein
 the at least one second inductor portion comprises a plurality of second inductor portions, and
 the ground layer is located between the inner-layer inductor portion and one of the second inductor portions being located on a signal path connected to the input pad electrode and being closer than the other second inductor portions on the signal path to the input pad electrode.

16. The radio-frequency module according to claim 15, wherein a distance between the ground layer and the inner-layer inductor portion is shorter than a distance between the ground layer and one of the second inductor portions closer than the other second inductor portions in the second matching circuit to the input pad electrode.

17. The radio-frequency module according to claim 11, configured to perform simultaneous communication by using the power amplifier and the low-noise amplifier.

18. A communication device comprising:
 the radio-frequency module according to claim 11; and
 a signal processing circuit configured to process the transmission signals and the reception signals.

19. The radio-frequency module according to claim 3, wherein one of the first inductor portions closer than the other first inductor portions to the output pad electrode is at least one of a series inductor portion included in the first matching circuit and located on a signal path connected to the output pad electrode and a parallel inductor portion included in the first matching circuit and located between the signal path and a ground.

20. The radio-frequency module according to claim 3, wherein
 the second power amplifier is mounted on the first main surface or the second main surface of the multilayer substrate, and
 the ground layer between the first main surface and the second main surface is located closer than the inner-layer inductor portion to one of the first and second main surfaces on which the second power amplifier is mounted.

* * * * *